United States Patent
Morita

(10) Patent No.: US 8,402,622 B2
(45) Date of Patent: Mar. 26, 2013

(54) METHOD FOR PRODUCING LIQUID TRANSPORT APPARATUS INCLUDING PIEZOELECTRIC ACTUATOR AND METHOD FOR PRODUCING PIEZOELECTRIC ACTUATOR

(75) Inventor: Yoshitsugu Morita, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 1030 days.

(21) Appl. No.: 12/363,737

(22) Filed: Jan. 31, 2009

(65) Prior Publication Data

US 2009/0195623 A1 Aug. 6, 2009

(30) Foreign Application Priority Data

Jan. 31, 2008 (JP) ................... 2008-020262
Nov. 27, 2008 (JP) ................... 2008-302633

(51) Int. Cl.
*H04R 17/10* (2006.01)
*B41J 2/045* (2006.01)

(52) U.S. Cl. .......... 29/25.35; 29/890.1; 29/842; 29/846; 347/70; 347/71; 347/72; 427/100

(58) Field of Classification Search ............. 29/25.35, 29/890.1, 842, 831, 846, 593; 347/69–72; 427/100

See application file for complete search history.

(56) References Cited

U.S. PATENT DOCUMENTS

| | | | |
|---|---|---|---|
| 3,931,446 A * | 1/1976 | Murayama et al. | ....... 427/100 X |
| 5,057,801 A | 10/1991 | Kittaka et al. | |
| 6,174,051 B1 | 1/2001 | Sakaida | |
| 6,450,626 B2 | 9/2002 | Ikeda et al. | |
| 6,679,588 B2 * | 1/2004 | Takahashi | ....... 347/72 X |
| 2004/0070650 A1 | 4/2004 | Sugahara | |
| 2004/0135852 A1 | 7/2004 | Suzuki | |
| 2005/0285911 A1 * | 12/2005 | Sugahara | ............ 347/71 |
| 2006/0042060 A1 | 3/2006 | Goat | |

FOREIGN PATENT DOCUMENTS

| | | |
|---|---|---|
| JP | H01-191508 A | 8/1989 |
| JP | H02-219313 A | 8/1990 |
| JP | H10-058674 A | 3/1998 |
| JP | 2000-006396 A | 1/2000 |

(Continued)

OTHER PUBLICATIONS

Japan Patent Office, Notice of Reasons for Rejection for Japanese Patent Application No. 2008-302633 (counterpart to above-captioned patent application), mailed Nov. 1, 2011.

*Primary Examiner* — A. Dexter Tugbang
(74) *Attorney, Agent, or Firm* — Baker Botts L.L.P.

(57) ABSTRACT

When a piezoelectric actuator, having a lower electrode, an intermediate electrode, and an upper electrode respectively on upper surfaces of a vibration plate, a lower piezoelectric layer, and an upper piezoelectric layer mutually stacked, is produced, a voltage of 30 V is applied to the upper and the intermediate electrodes, and −30 V is applied to the lower electrode so that a second active portion, which is included in portions of the piezoelectric layers interposed between the upper and the lower electrodes and from which a portion opposed to the intermediate electrode is excluded, is polarized downwardly. After that, 0 V is applied to the upper and lower electrodes, and 30 V is applied to the intermediate electrode so that a first active portion, which is included in the upper piezoelectric layer and which is interposed between the upper and the intermediate electrodes, is polarized upwardly.

7 Claims, 12 Drawing Sheets

FOREIGN PATENT DOCUMENTS

| | | |
|---|---|---|
| JP | 2000-133852 A | 5/2000 |
| JP | 2002-292865 A | 10/2002 |
| JP | 2002355965 A * | 12/2002 |
| JP | 3396196 B2 | 2/2003 |
| JP | 2004-136461 A | 5/2004 |
| JP | 2004-202814 A | 7/2004 |
| JP | 2004-241669 A | 8/2004 |
| JP | 2006-500761 A | 1/2006 |

* cited by examiner

SCANNING DIRECTION
PAPER FEEDING DIRECTION

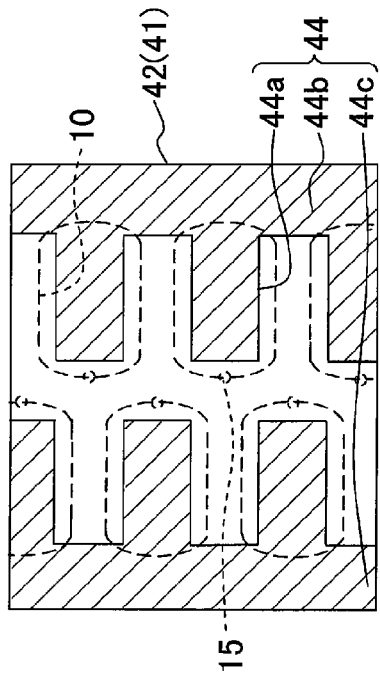
Fig. 4A
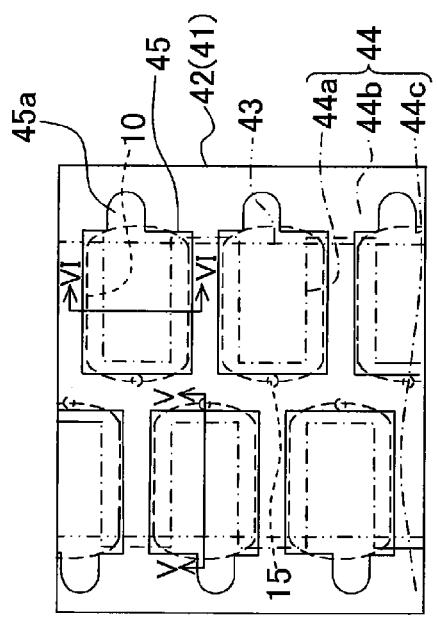
Fig. 4C
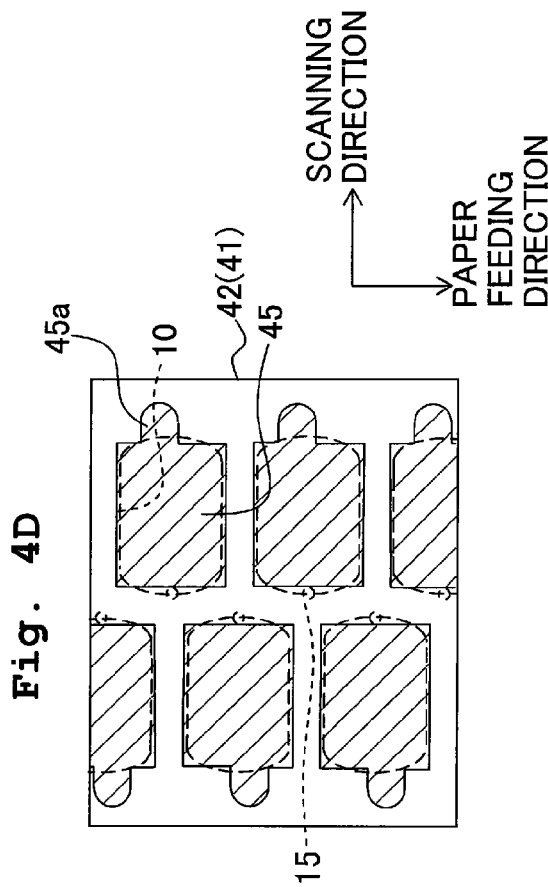
Fig. 4B
Fig. 4D

METHOD FOR PRODUCING LIQUID TRANSPORT APPARATUS INCLUDING PIEZOELECTRIC ACTUATOR AND METHOD FOR PRODUCING PIEZOELECTRIC ACTUATOR

CROSS REFERENCE TO RELATED APPLICATION

The present application claims priorities from Japanese Patent Application No. 2008-020262, filed on Jan. 31, 2008 and Japanese Patent Application No. 2008-302633, filed on Nov. 27, 2008, the disclosures of which are incorporated herein by reference in their entirety.

BACKGROUND OF THE INVENTION

1. Field of the Invention

The present invention relates to a method for producing a liquid transport apparatus which transports a liquid by applying a pressure to the liquid contained in a pressure chamber, and a method for producing a piezoelectric actuator to be used for such a liquid transport apparatus.

2. Description of the Related Art

A common electrode is arranged in a substantially entire region of a lower surface of a piezoelectric layer which covers pressure chambers in an ink-jet head described in Japanese Patent No. 3396196, Individual electrodes are arranged on an upper surface of the piezoelectric layer so that they are opposed to substantially central portions of the pressure chambers. Further, auxiliary individual electrodes are arranged so that they are opposed to portions of the pressure chambers, the portions being disposed on the outer side as compared with portions of the pressure chambers opposed to the individual electrodes. When the voltage is applied between the individual electrode and the common electrode to shrink a portion of the piezoelectric layer by generating the electric field at the portion of the piezoelectric layer interposed between the electrodes, a constraint plate, which is arranged on the upper surface of the portion of the piezoelectric layer opposed to the individual electrode, is deformed. Further, simultaneously therewith, when the voltage is also applied between the auxiliary individual electrode and the common electrode to elongate the portion of the piezoelectric layer interposed between the electrodes by generating the electric field in the direction opposite to the above at the portion of the piezoelectric layer interposed between the electrodes, then the portion of the piezoelectric layer, which is interposed between the individual electrode and the common electrode, is shrunk easily, and the amount of deformation of the constraint plate is increased.

An ink-jet head type recording head described in Japanese Patent Application Laid-open No. 2000-6396 includes a lower electrode film, a piezoelectric layer, and an upper electrode film which are arranged and mutually stacked in this order from the bottom, on an upper surface of an elastic film which covers pressure chambers. The piezoelectric layer and the upper electrode film are divided into portions which are opposed to substantially central portions of the pressure chambers and portions which are opposed to ends of the pressure chambers and portions disposed between the adjoining pressure chambers respectively. The portions of the piezoelectric layer, the upper electrode film, and the lower electrode film, which are opposed to the substantially central portions of the pressure chambers, serve as first piezoelectric vibrators, and the portions of the piezoelectric layer, the upper electrode film, and the lower electrode film, which are opposed to the ends of the pressure chambers, serve as second piezoelectric vibrators. In this arrangement, the portion of the elastic film, which is opposed to the pressure chamber, is pulled upwardly by applying the voltage to the second piezoelectric vibrator to shrink the portion of the piezoelectric layer for constructing the second piezoelectric vibrator. After that, the second piezoelectric vibrator is released from the application of the voltage, and the voltage is applied to the first piezoelectric vibrator to shrink the portion of the piezoelectric layer for constructing the first piezoelectric vibrator. Accordingly, the portion of the elastic film, which is opposed to the pressure chamber, is deformed so that the portion projects toward the pressure chamber, and thus the ink is discharged from the nozzle. When the elastic film is once pulled upwardly, and the deformation is thereafter brought about to project toward the pressure chamber as described above, then it is possible to increase the amount of deformation of the elastic film.

In the case of an ink-jet head described in Japanese Patent Application Laid-open No. 2004-136461, a plurality of electrodes are buried or embedded in a piezoelectric layer in the in-plane direction thereof. Mutually adjoining portions, which are included in a plurality of portions interposed between the plurality of electrodes of the piezoelectric layer, are polarized in the opposite directions.

In the case of an ink-jet head described in Japanese Patent Application Laid-open No. 2002-292865, first electrodes are arranged respectively at portions of a piezoelectric layer opposed to walls disposed on both sides of pressure chambers in relation to one predetermined direction, and second electrodes are arranged at portions of the piezoelectric layer opposed to substantially central portions of the pressure chambers. As for the piezoelectric layer, the portion which is disposed between the second electrode and the first electrode arranged at the portion opposed to one of the walls of the pressure chamber and the portion which is disposed between the second electrode and the first electrode arranged at the portion opposed to the other wall of the pressure chamber are polarized respectively in directions inclined toward the mutually opposite sides in relation to the in-plane direction of the piezoelectric layer with respect to the thickness direction of the piezoelectric layer from the second electrode toward the first electrode.

In view of the above, in relation to the descriptions of Japanese Patent No. 3396196 and Japanese Patent Application Laid-open Nos. 2000-6396, 2004-136461, and 2002-292865, the inventors of the present invention have found out that an advantageous situation arises in the design of the piezoelectric actuator when the two adjoining portions of the piezoelectric layer are polarized in the mutually opposite directions in the piezoelectric actuator in which the electrodes are arranged so that the mutually adjoining portions of the piezoelectric layer are interposed respectively as described in Japanese Patent No. 3396196 and Japanese Patent Application Laid-open No. 2000-6396.

However, when the two adjoining portions of the piezoelectric layer are polarized in the mutually opposite directions, if the electric field is generated in order to polarize one of the two portions, then the polarization of the other is weakened by the electric field. As a result, it is feared that the amount of deformation of the piezoelectric layer may be decreased.

SUMMARY OF THE INVENTION

An object of the present invention is to provide a method for producing a liquid transport apparatus which makes it possible to polarize mutually adjoining portions of a piezoelectric layer in mutually opposite directions while maximally suppressing the decrease in the amount of deformation of the piezoelectric layer, and a method for producing a piezoelectric actuator to be used for such a liquid transport apparatus.

According to a first aspect of the present invention, there is provided a method for producing a liquid transport apparatus, the liquid transport apparatus including: a flow passage unit which is formed with a liquid transport flow passage including a pressure chamber; a piezoelectric actuator which applies a pressure to a liquid in the pressure chamber by changing a volume of the pressure chamber, the piezoelectric actuator including: a piezoelectric layer having a first active portion which is polarized in a predetermined direction parallel to a thickness direction of the piezoelectric layer and a second active portion which is adjacent to the first active portion and polarized in a direction opposite to the predetermined direction; a pair of first electrodes which interpose the first active portion in the thickness direction of the piezoelectric layer; and a pair of second electrodes which interpose the second active portion in the thickness direction of the piezoelectric layer, a change amount of the volume of the pressure chamber, which is obtained by deforming the piezoelectric layer by applying a driving voltage between the first electrodes, being greater than a change amount of the volume of the pressure chamber, which is obtained by deforming the piezoelectric layer by applying the driving voltage between the second electrodes, the method including: polarizing the second active portion in the direction opposite to the predetermined direction by applying a polarizing voltage between the second electrodes; and polarizing the first active portion in the predetermined direction by applying the polarizing voltage between the first electrodes after polarizing the second active portion.

If the second active portion is polarized after polarizing the first active portion, or if the first active portion and the second active portion are simultaneously polarized, then the portion of the first active portion, which is disposed adjacently to the second active portion, is weakly polarized by the electric field to be applied in order to polarize the second active portion. If the change amount of the volume of the pressure chamber, which is brought about by applying the driving voltage between the first electrode pair, is greater than the change amount of the volume of the pressure chamber which is brought about by applying the driving voltage between the second electrode pair, the weakened polarization of the first active portion greatly decreases the change amount of the volume of the pressure chamber which is to be obtained when the piezoelectric actuator is driven. As a result, the transport efficiency of the liquid is greatly lowered.

However, in the present invention, the first active portion is polarized after the second active portion has been polarized. Therefore, the polarization of the first active portion, which greatly affects the change of the volume of the pressure chamber, is not weakened. It is possible to maximally suppress the decrease in the transport efficiency of the liquid. The application of the voltage (driving voltage, polarizing voltage) between the electrode pair has the same meaning as that of the application of the electric field between the electrode pair.

In the method for producing the liquid transport apparatus of the present invention, the piezoelectric actuator may further include a vibration plate which covers the pressure chamber, the piezoelectric layer being arranged on a side of the vibration plate not facing the pressure chamber; the first active portion may be opposed to a portion of the pressure chamber; and the second active portion may be opposed to another portion, of the pressure chamber, adjacent to the portion of the pressure chamber.

When the piezoelectric actuator includes the vibration plate which covers the pressure chamber therewith, the piezoelectric layer is arranged on a surface, of the vibration plate, opposite to the pressure chamber, the first active portion is opposed to the part of the pressure chamber, and the second active portion is opposed to the portion of the pressure chamber disposed adjacently to the part described above, then the portions of the piezoelectric layer and the vibration plate opposed to the pressure chamber are deformed, and the volume of the pressure chamber is changed, when the driving voltage is applied to the first electrode pair and the second electrode pair. However, even in the case of the piezoelectric actuator as described above, the change amount of the volume of the pressure chamber, which is obtained when the driving voltage is applied to the first electrode pair, can be made greater than that obtained when the driving voltage is applied to the second electrode pair. Even in such a case, the polarization of the first active portion, which greatly affects the change of the volume of the pressure chamber, is not weakened, owing to the fact that the first active portion is polarized after the second active portion has been polarized. Therefore, it is possible to maximally suppress the decrease in the liquid transport efficiency.

In the method for producing the liquid transport apparatus of the present invention, one of the first active portion and the second active portion may be opposed to a central portion of the pressure chamber, and the other of the first and second active portions may be opposed to an outer portion disposed outside the central portion of the pressure chamber opposed to one of the first and second active portions.

When one of the first active portion and the second active portion is arranged opposingly to the central portion of the pressure chamber, and the other is arranged opposingly to the portion disposed on the outer side as compared with the portion of the pressure chamber opposed to the one, then the change amount of the volume of the pressure chamber, which is brought about when the driving voltage is applied between the first electrode pair, can be made greater than the change amount of the volume of the pressure chamber which is brought about when the driving voltage is applied between the second electrode pair. Even in such a situation, when the first active portion is polarized after polarizing the second active portion, the polarization of the first active portion, which greatly affects the change of the volume of the pressure chamber, is not weakened. It is possible to maximally suppress the decrease in the liquid transport efficiency.

In the method for producing the liquid transport apparatus of the present invention, the piezoelectric layer may have a lower piezoelectric layer which is arranged on a surface, of the vibration plate, on a side opposite to the pressure chamber, and an upper piezoelectric layer which is arranged on a surface, of the lower piezoelectric layer, on a side opposite to the vibration plate; the first active portion may be provided at a portion of the upper piezoelectric layer opposed to the central portion of the pressure chamber; the second active portion may be provided at a portion of the lower piezoelectric layer and a portion of the upper piezoelectric layer which are opposed to the outside portion of the pressure chamber disposed outside the central portion of the pressure chamber opposed to the first active portion; the pair of first electrodes may be constructed of an upper electrode arranged on the surface, of the upper piezoelectric layer, on the side opposite to the lower piezoelectric layer to range over a portion of the upper piezoelectric layer opposed to the first and second active portions, and an intermediate electrode arranged between the upper piezoelectric layer and the lower piezoelectric layer to be opposed to the first active portion; and the pair of second electrodes may be constructed of the upper electrode and a lower electrode which is arranged on a surface, of the lower piezoelectric layer, facing the vibration plate to range over a portion of the lower piezoelectric layer to be opposed to the first and second active portions.

When the piezoelectric layer is constructed by stacking the lower piezoelectric layer and the upper piezoelectric layer, the first active portion is formed at the portion of the upper piezoelectric layer opposed to the substantially central portion of the pressure chamber, the second active portion is formed at the portions of the upper piezoelectric layer and the lower piezoelectric layer opposed to the portion disposed on the outer side as compared with the portion of the pressure chamber opposed to the first active portion, the first electrode pair is constructed by the upper electrode and the intermediate electrode, and the second electrode pair is constructed by the upper electrode and the lower electrode, then the change amount of the volume of the pressure chamber, which is brought about by applying the driving voltage between the first electrode pair, can be made greater than the change amount of the volume of the pressure chamber which is brought about by applying the driving voltage between the second electrode pair.

Therefore, when the first active portion is polarized after polarizing the second active portion in the liquid transport apparatus as described above, the polarization of the first active portion, which greatly affects the change of the volume of the pressure chamber, is not weakened. It is possible to maximally suppress the decrease in the liquid transport efficiency.

Further, in order to simultaneously polarize the first active portion and the second active portion in the liquid transport apparatus as described above, it is necessary that the electric potential of the upper electrode is made lower than the electric potential of the intermediate electrode, and the electric potential of the lower electrode is made lower than the electric potential of the upper electrode. Due to this necessity, it is feared that any great electric field may be generated at the portion of the lower piezoelectric layer interposed between the intermediate electrode and the lower electrode, and any crack may consequently appear at the concerning portion of the lower piezoelectric layer. However, in the present invention, the first active portion is polarized after polarizing the second active portion. Therefore, when the first active portion and the second active portion are polarized, the electric potentials of the electrodes, which do not directly relate to the polarization, can be such electric potentials that any great electric field is not generated at the portion of the lower piezoelectric layer interposed between the intermediate electrode and the lower electrode respectively.

In the method for producing the liquid transport apparatus of the present invention, when the second active portion is polarized, the polarizing voltage may be applied between the upper electrode and the lower electrode by applying, to the lower electrode, an electric potential lower than that applied to the upper electrode in a state that same electric potential is applied to the upper electrode and the intermediate electrode; and when the first active portion is polarized, the polarizing voltage may be applied between the upper electrode and the intermediate electrode by applying, to the intermediate electrode, an electric potential higher than that applied to the upper electrode in a state that same electric potential is applied to the upper electrode and the lower electrode.

It is known that the piezoelectric characteristic is deteriorated when the direction of polarization is inverted in the first active portion and the second active portion during the process for polarizing the first active portion and the second active portion. However, according to the present invention, it is possible to polarize the first active portion and the second active portion without causing the inversion of the direction of polarization in the first active portion and the second active portion when the first and second active portion are polarized.

In the method for producing the liquid transport apparatus of the present invention, when the second active portion is polarized, the polarizing voltage may be applied between the upper electrode and the lower electrode by applying, to the upper electrode, an electric potential higher than that applied to the lower electrode in a state that same electric potential is applied to the intermediate electrode and the lower electrode; and when the first active portion is polarized, the polarizing voltage may be applied between the upper electrode and the intermediate electrode by applying, to the intermediate electrode, an electric potential higher than that applied to the upper electrode in a state that same electric potential is applied to the upper electrode and the lower electrode.

Accordingly, the first active portion and the second active portion can be polarized without generating any great electric field at the portion of the lower piezoelectric layer which is interposed between the intermediate electrode and the lower electrode and which is not the first active portion and the second active portion. It is possible to avoid the appearance of any crack at the portion of the lower piezoelectric layer interposed between the intermediate electrode and the lower electrode.

In the method for producing the liquid transport apparatus of the present invention, when the second active portion is polarized, the polarizing voltage may be applied between the upper electrode and the lower electrode by applying, to the lower electrode, an electric potential lower than that applied to the upper electrode and applying, to the intermediate electrode, an electric potential which is between those applied to the upper electrode and the lower electrode; and when the first active portion is polarized, the polarizing voltage may be applied between the upper electrode and the intermediate electrode by applying, to the intermediate electrode, an electric potential higher than those applied to the upper electrode and the lower electrode in a state that same electric potential is applied to the upper electrode and the lower electrode.

Accordingly, it is possible to maximally decrease the electric field generated in the upper piezoelectric layer and the lower piezoelectric layer when the first active portion and the second active portion are polarized.

According to a second aspect of the present invention, there is provided a method for producing a piezoelectric actuator usable for a liquid transport apparatus, the liquid transport apparatus including: a flow passage unit which is formed with a liquid transport flow passage including a pressure chamber; a piezoelectric actuator which applies a pressure to a liquid in the pressure chamber by changing a volume of the pressure chamber, the piezoelectric actuator including: a piezoelectric layer having a first active portion which is polarized in a predetermined direction parallel to a thickness direction of the piezoelectric layer and a second active portion which is adjacent to the first active portion and polarized in a direction opposite to the predetermined direction; a pair of first electrodes which interpose the first active portion in the thickness direction of the piezoelectric layer; and a pair of second electrodes which interpose the second active portion in the thickness direction of the piezoelectric layer, a change amount of the volume of the pressure chamber, which is obtained by deforming the piezoelectric layer by applying a driving voltage between the first electrodes, being greater than a change amount of the volume of the pressure chamber, which is obtained by deforming the piezoelectric layer by applying the driving voltage between the second electrodes, the method including: polarizing the second active portion in the direction opposite to the predetermined direction by applying a polarizing voltage between the second electrodes; and polarizing the first active portion in the predetermined direction by applying the polarizing voltage between the first electrodes after polarizing the second active portion.

BRIEF DESCRIPTION OF THE DRAWINGS

FIG. 4A shows a partial enlarged view illustrating those shown in FIG. 3, and FIGS. 4B to 4D show surfaces of respective plates shown in FIG. 4A.

DESCRIPTION OF THE PREFERRED EMBODIMENTS

A preferred embodiment of the present invention will be explained below.

Figure 1:
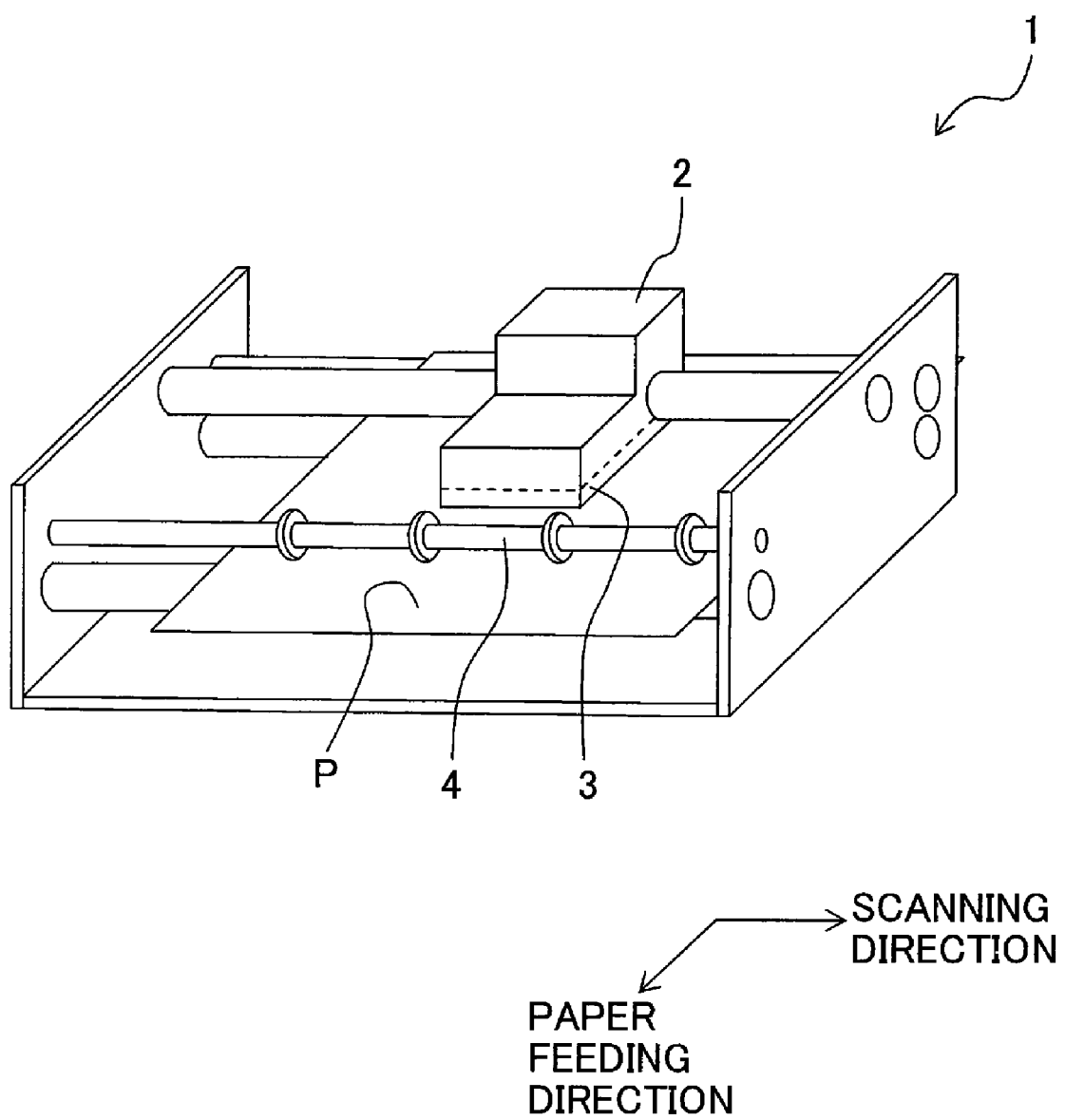
FIG. 1 shows a schematic arrangement of a printer according to an embodiment of the present invention.

FIG. 1 shows a schematic arrangement of a printer according to an embodiment of the present invention. As shown in FIG. 1, the printer 1 includes, for example, a carriage 2, an ink-jet head 3, and a transport roller 4.

The carriage 2 reciprocates in the scanning direction (left-right direction as viewed in FIG. 1). The ink-jet head 3 is attached to the lower surface of the carriage 2, and the inks are discharged from nozzles 15 (see FIG. 3) formed on the lower surface thereof. The transport roller 4 transports the recording paper P in the paper feeding direction (direction directed toward the front of FIG. 1). In the printer 1, the inks are discharged to the recording paper P from the nozzles 15 of the ink-jet head 3 which reciprocates in the scanning direction together with the carriage 2, and thus the printing is performed on the recording paper P. The recording paper P, on which the printing has been completed, is discharged in the paper feeding direction by the transport roller 4.

Figure 2:
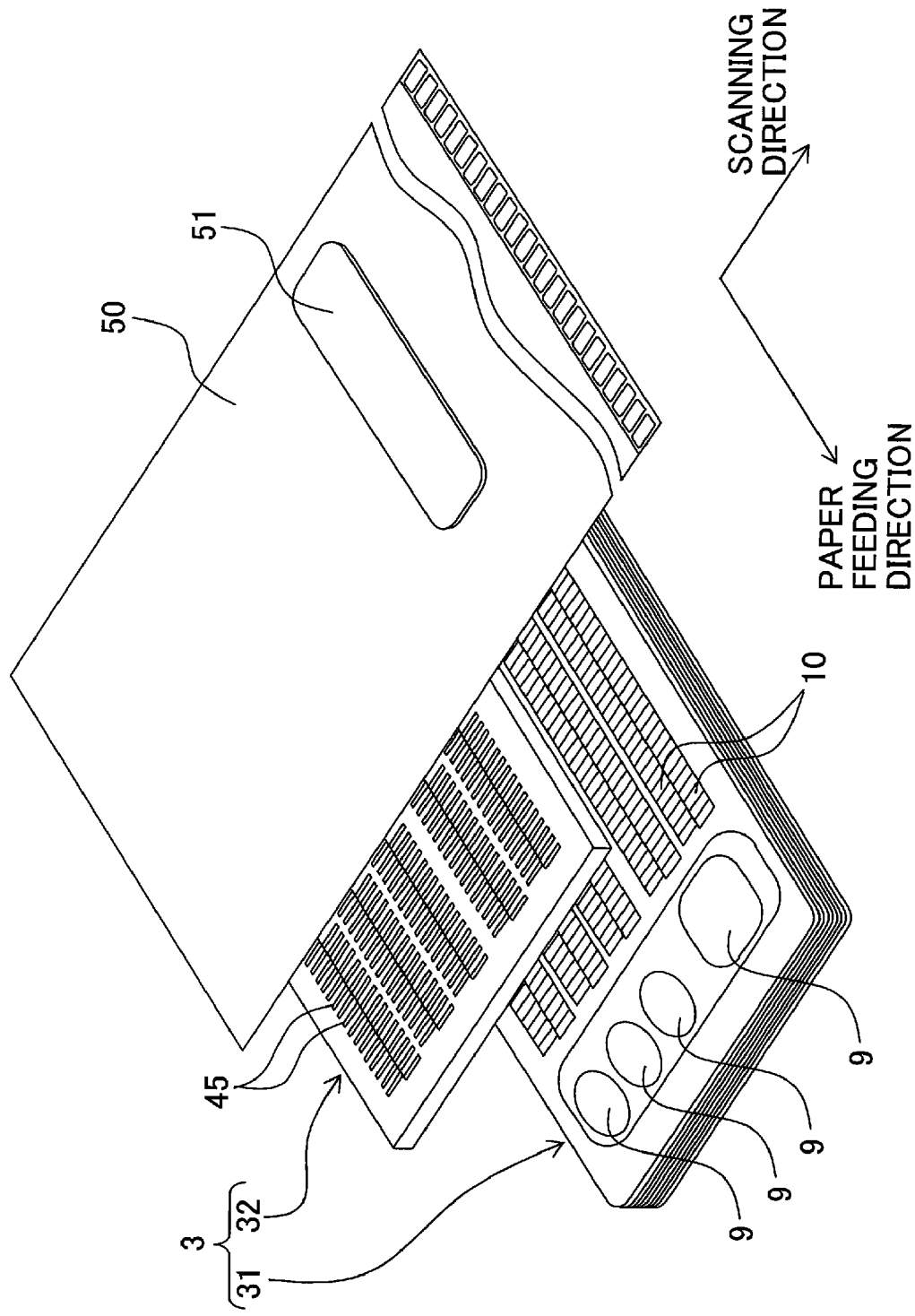
FIG. 2 shows an exploded perspective view illustrating an ink-jet head shown in FIG. 1.
Figure 3:
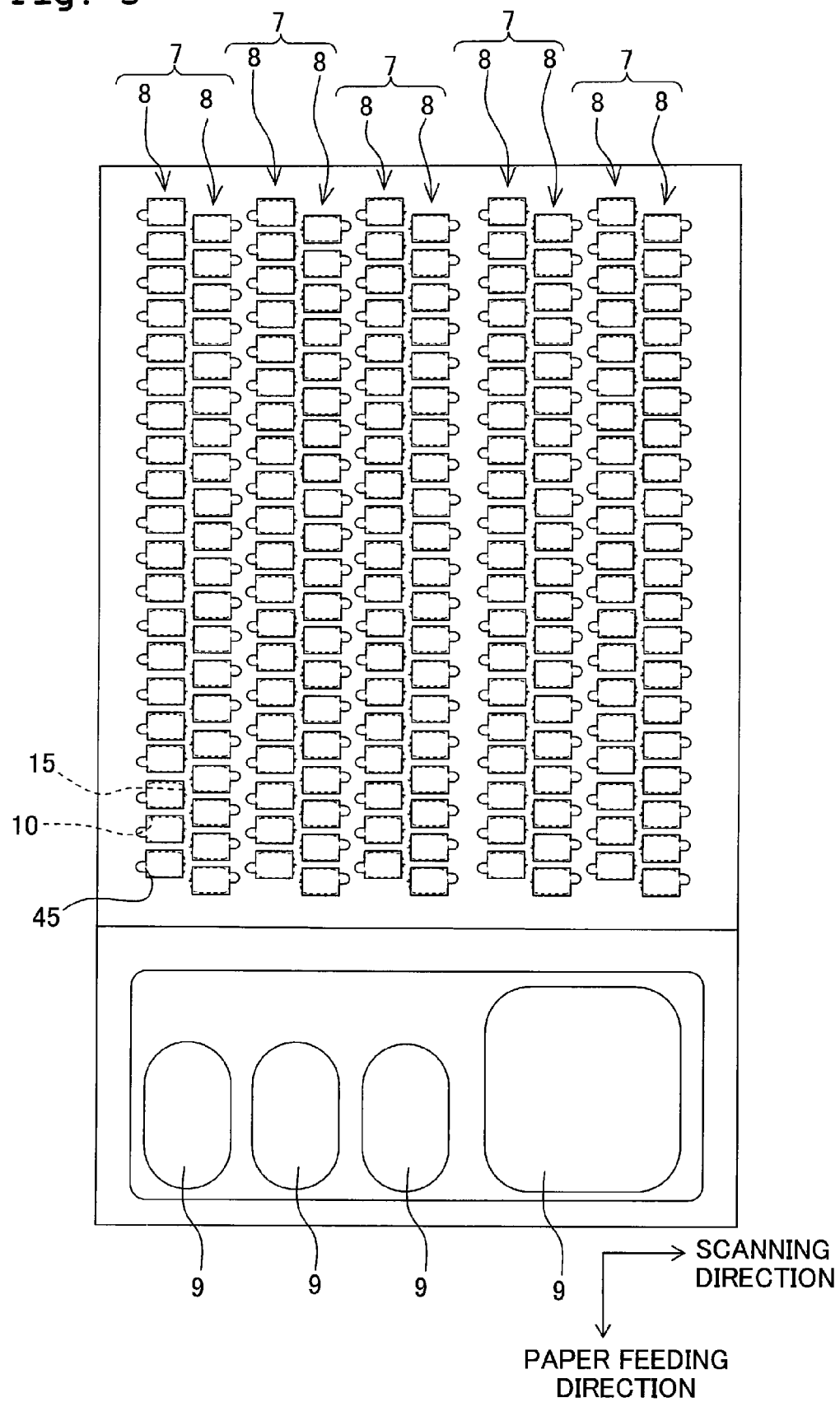
FIG. 3 shows a plan view illustrating the ink-jet head shown in FIG. 2.
Figure 5:
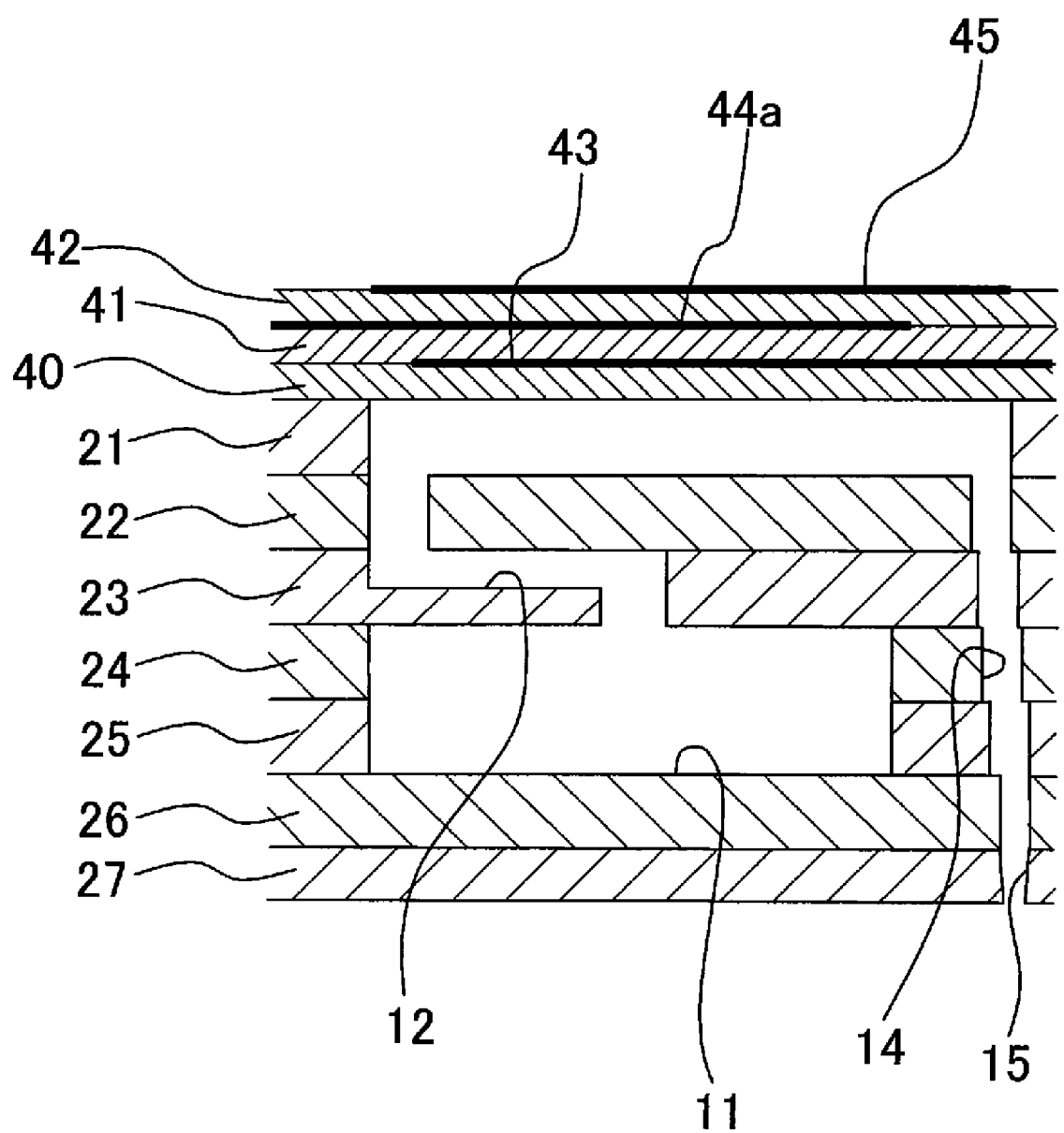
FIG. 5 shows a sectional view taken along a line V-V shown in FIG. 4A.
Figure 6:
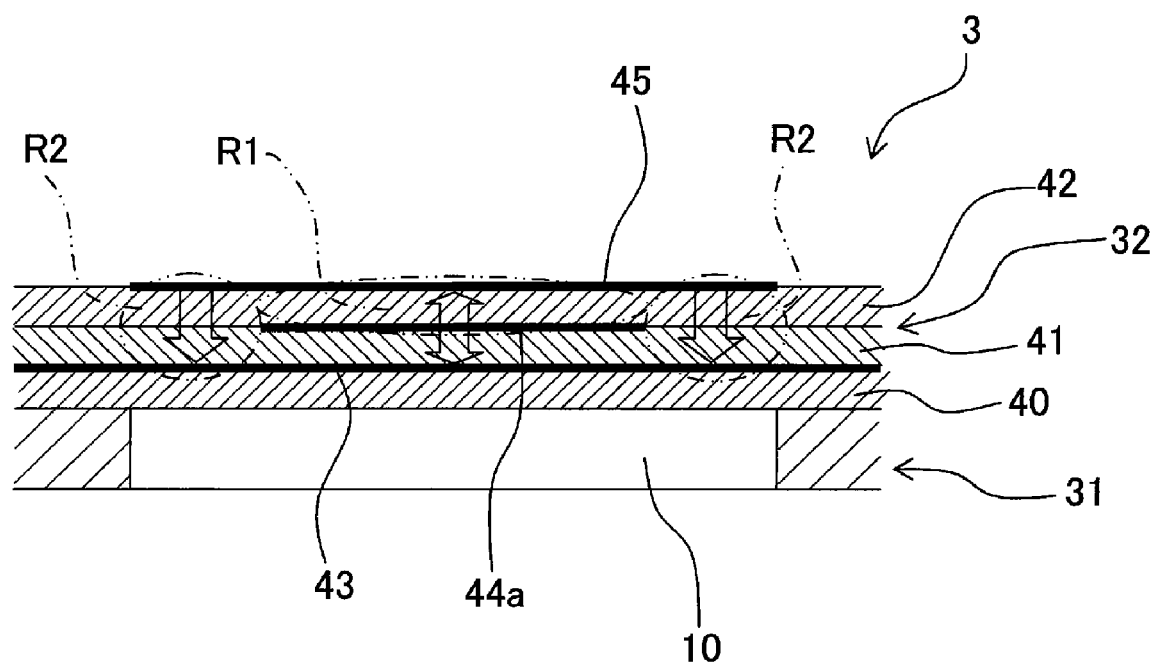
FIG. 6 shows a sectional view taken along a line VI-VI shown in FIG. 4A.

Next, the ink-jet head 3 will be explained in detail. FIG. 2 shows an exploded perspective view illustrating the ink-jet head 3 shown in FIG. 1. FIG. 3 shows a plan view illustrating the ink-jet head 3 shown in FIG. 2. FIG. 4A shows a partial enlarged view illustrating those shown in FIG. 3. FIGS. 4B to 4D show upper surfaces of a vibration plate 40, a piezoelectric layer 41, and a piezoelectric layer 42 respectively as described later on in relation to FIG. 4A. FIG. 5 shows a sectional view taken along a line V-V shown in FIG. 4A. FIG. 6 shows a sectional view taken along a line VI-VI shown in FIG. 4A.

In order to understand the drawings more comprehensively, ink flow passages except for the nozzles 15 and pressure chambers 10 of a flow passage unit 31 described later on are omitted from the illustration in FIGS. 3 and 4. In FIG. 3, any lower electrode 43 and any intermediate electrode 44 of a piezoelectric actuator 32 are omitted from the illustration. In FIG. 4A, the lower electrode 43 and the intermediate electrode 44, both of which are to be depicted by broken lines, are depicted by alternate long and two short dashes lines and alternate long and short dash lines respectively. In FIGS. 4B to 4D, the lower electrode 43, the intermediate electrode 44, and upper electrodes 45 described later on are hatched respectively. In FIG. 6, portions of the flow passage unit 31, which are disposed at positions lower than the pressure chamber 10, are omitted from the illustration.

As shown in FIGS. 2 to 6, the ink-jet head 3 is provided with the flow passage unit 31 and the piezoelectric actuator 32. The flow passage unit 31 is constructed by mutually stacking a plurality of plates 21 to 27, and thus the flow passage unit 31 is formed with manifold flow passages 11 to which the inks are supplied from ink supply ports 9, and ink flow passages (liquid transport flow passages) having a plurality of individual ink flow passages which extend from outlets of the manifold flow passages 11 via aperture flow passages 12 to arrive at the pressure chambers 10 and which further extend from the pressure chambers 10 via descender flow passages 14 to arrive at the nozzles 15. As described later on, when the pressure is applied to the ink contained in the pressure chamber 10 by the piezoelectric actuator 32, the ink is discharged with the nozzle 15 which is communicated with the pressure chamber 10.

The plurality of pressure chambers 10 have substantially elliptic planar shape in which the scanning direction (left-right direction as viewed in FIG. 3) is the longitudinal direction. The plurality of pressure chambers 10 are arranged in the paper feeding direction (upward-downward direction as viewed in FIG. 3) to constitute one pressure chamber array 8. Such pressure chamber arrays 8 are arranged in two arrays in the scanning direction, and thus one pressure chamber array group 7 is constructed. Five of such pressure chamber array groups 7 are arranged in the scanning direction. In this arrangement, the pressure chambers 10, which constitute two arrays of the pressure chamber arrays 8 included in one pressure chamber array group 7, are arranged while being shifted from each other in the paper feeding direction. The plurality of nozzles 15 are also arranged in the same manner as the plurality of pressure chambers 10.

The black ink is discharged from the nozzles 15 corresponding to the pressure chambers 10 which constitute two of the five pressure chamber array groups 7 disposed on the right side as shown in FIG. 3. The yellow, cyan, and magenta inks are discharged from the nozzles 15 corresponding to the pressure chambers 10 which constitute three of the pressure chamber groups 7 disposed on the left side as shown in FIG. 3 in an order as starting from the nozzles 15 arranged on the right side as shown in FIG. 3. The other portions of the ink flow passages are constructed in the same manner as those of conventional passages, any detailed explanation of which is herein omitted.

The piezoelectric actuator 32 is provided with the vibration plate 40, the lower piezoelectric layer 41, the upper piezoelectric layer 42, the lower electrode 43, the intermediate electrode 44, and the upper electrodes 45. The vibration plate 40 is composed of a piezoelectric material containing a main component of lead zirconium titanate which is a mixed crystal of lead titanate and lead zirconate. The vibration plate 40 is arranged on the upper surface of the flow passage unit 31 so that the plurality of pressure chambers 10 are covered therewith. The thickness of the vibration plate 40 is about 20 μm. It is not necessarily indispensable that the vibration plate 40 is composed of the piezoelectric material.

Each of the lower piezoelectric layer 41 and the upper piezoelectric layer 42 is composed of a piezoelectric material which is the same as or equivalent to that of the vibration plate 40. The lower piezoelectric layer 41 and the upper piezoelectric layer 42 are mutually stacked and arranged on the upper surface of the vibration plate 40. The thicknesses of the lower piezoelectric layer 41 and the upper piezoelectric layer 42 are about 20 μm respectively. The structure, which is obtained by mutually stacking the lower piezoelectric layer 41 and the upper piezoelectric layer 42, corresponds to the piezoelectric layer according to the present invention.

The lower electrode 43 is arranged between the vibration plate 40 and the lower piezoelectric layer 41 (on the surface of the piezoelectric layer disposed on the side of the vibration plate 40). Corresponding to each of the pressure chamber array groups 7, the lower electrode 43 extends in the paper feeding direction along the two arrays of the pressure chamber arrays 8 which form each of the pressure chamber array groups 7. The lower electrode 43 is opposed to the plurality of pressure chambers 10 which constitute the two arrays of the pressure chamber arrays 8. Although not shown, the portions, which extend in the paper feeding direction as described above, are connected to one another. The lower electrode 43 is connected to a driver IC 51 via a flexible printed circuit (FPC) 50 arranged over or above the piezoelectric actuator 32. The lower electrode 43 is always retained at the ground electric potential by the driver IC 51.

The intermediate electrode 44 is arranged between the lower piezoelectric layer 41 and the upper piezoelectric layer 42. The intermediate electrode 44 has a plurality of opposing portions 44a and connecting portions 44b, 44c respectively for each of the pressure chamber array groups 7. The plurality of opposing portions 44a have substantially rectangular planar shapes in each of which the length in relation to the paper feeding direction is shorter than that of the pressure chamber 10. The plurality of opposing portions 44a are arranged so that they are opposed to substantially central portions of the plurality of pressure chambers 10 in relation to the paper feeding direction.

The connecting portion 44b extends in the paper feeding direction to mutually connect right ends shown in FIG. 4 of the plurality of opposing portions 44a corresponding to the plurality of pressure chambers 10 which form the pressure chamber array 8 arranged on the right side in FIG. 4, of the two arrays of the pressure chamber arrays 8 which form each of the pressure chamber array groups 7. The connecting portion 44c extends in the paper feeding direction to mutually connect left ends shown in FIG. 4 of the plurality of opposing portions 44a corresponding to the plurality of pressure chambers 10 which form the pressure chamber array 8 arranged on the left side in FIG. 4, of the two arrays of the pressure chamber arrays 8 which form each of the pressure chamber array groups 7. The intermediate electrode 44 is connected to the driver IC 51 via FPC 50. The intermediate electrode 44 is always retained at a predetermined electric potential (for example, about 20 V) by the driver IC 51.

The plurality of upper electrodes 45 are arranged on the upper surface of the upper piezoelectric layer 42 (on the surface disposed on the side opposite to the lower piezoelectric layer 41) corresponding to the plurality of pressure chambers 10 so that the plurality of upper electrodes 45 are opposed to the substantially entire regions of the plurality of pressure chambers 10. The plurality of upper electrodes 45 have substantially rectangular planar shapes in each of which the length in relation to the paper feeding direction is longer than that of the opposing portion 44a of the intermediate electrode 44. Portions of the upper electrodes 45, which are disposed at ends on the side opposite to the nozzles 15 in relation to the scanning direction, extend in the scanning direction to portions which are not opposed to the pressure chambers 10. The portions serve as connecting terminals 45a which are connected to FPC 50. The upper electrode 45 is connected to the driver IC 51 via FPC, for which the electric potential thereof is switched between the ground electric potential and the predetermined electric potential described above (for example, 20 V).

When the lower electrode 43, the intermediate electrode 44, and the upper electrode 45 are arranged as described above, the portion (first active portion R1) of the upper piezoelectric layer 42, which is opposed to the substantially central portion of the pressure chamber 10, is interposed between the upper electrode 45 and the intermediate electrode 44. The first active portion R1 is polarized in the upward direction directed from the intermediate electrode 44 to the upper electrode 44 (in one predetermined direction parallel to the thickness direction of the upper piezoelectric layer 42).

Further, the portions of the upper piezoelectric layer 42 and the lower piezoelectric layer 41, which are opposed to the pressure chamber 10, are interposed between the upper electrode 45 and the lower electrode 43. The portion (second active portion R2) of the concerning portions, from which the portion opposed to the intermediate electrode 44 is excluded, is polarized in the downward direction directed from the upper electrode 45 to the lower electrode 43 (in the direction opposite to the one predetermined direction).

That is, the upper electrode 45 is arranged to range over the portion opposed to the first active portion R1 and the portion opposed to the second active portion R2 on the upper surface of the upper piezoelectric layer 42. The intermediate electrode 44 is arranged at the portion opposed to the first active portion R1 between the upper piezoelectric layer 42 and the lower piezoelectric layer 41. The lower electrode 43 is arranged to range over the portion opposed to the first active portion R1 and the portion opposed to the second active portion R2 on the lower surface of the lower piezoelectric layer 41. The upper electrode 45 and the intermediate electrode 44, which interpose the first active portion R1 as described above, constitute the first electrode pair according to the present invention. The upper electrode 45 and the lower electrode 43, which interpose the second active portion R2 as described above, constitute the second electrode pair according to the present invention.

The portion of the lower piezoelectric layer 41, which is interposed between the intermediate electrode 44 and the lower electrode 43, is polarized in the downward direction directed from the intermediate electrode 44 to the lower electrode 43.

The operation of the piezoelectric actuator 32 will now be explained. At first, in the waiting state before the piezoelectric actuator 32 performs the operation to discharge the inks, as described above, the lower electrode 43 and the intermediate electrode 44 are always retained at the ground electric potential and the predetermined electric potential (for example, 20

V) described above respectively, and the electric potential of the upper electrode 45 is previously retained at the ground electric potential. In this state, the electric potential of the upper electrode 45 is lower than the electric potential of the intermediate electrode 44, and the electric potential of the upper electrode 45 is the same as the electric potential of the lower electrode 43.

Accordingly, the electric potential difference arises between the upper electrode 45 and the intermediate electrode 44 (the driving voltage (electric field) is applied between the first electrode pair). The electric field, which is in the upward direction that is the same as the polarization direction, is generated in the first active portion R1. Accordingly, the first active portion R1 is shrunk in the horizontal direction perpendicular to the electric field. Accordingly, the so-called unimorph deformation is caused. The portions of the upper piezoelectric layer 42, the lower piezoelectric layer 41, and the vibration plate 40, which are opposed to the pressure chamber 10, are deformed to project toward the pressure chamber 10 as a whole. In this state, the volume of the pressure chamber 10 is decreased as compared with the situation in which the upper piezoelectric layer 42, the lower piezoelectric layer 41, and the vibration plate 40 are not deformed.

When the piezoelectric actuator 32 is driven in order to discharge the ink, then the electric potential of the upper electrode 45 is once switched to the predetermined electric potential described above, and then the electric potential of the upper electrode 45 is returned to the ground electric potential. When the electric potential of the upper electrode 45 is switched to the predetermined electric potential described above, then the upper electrode 45 has the same electric potential as that of the intermediate electrode 44, and the electric potential of the upper electrode 45 is higher than that of the lower electrode 43. Accordingly, the shrinkage of the first active portion R1 is returned to the initial or original state. Simultaneously therewith, the electric potential difference arises between the upper electrode 45 and the lower electrode 43 (the driving voltage (electric field) is applied between the second electrode pair). The electric field, which is in the downward direction that is the same as the polarization direction, is generated in the second active portion R2, and the second active portion R2 is shrunk in the horizontal direction. Accordingly, the upper piezoelectric layer 42, the lower piezoelectric layer 41, and the vibration plate 40 are deformed to project toward the side opposite to the pressure chamber 10 as a whole, and the volume of the pressure chamber 10 is increased.

However, in the piezoelectric actuator 32, the deformation amounts of the portions of the upper piezoelectric layer 42, the lower piezoelectric layer 41, and the vibration plate 40 opposed to the pressure chamber 10 (change amount of the volume of the pressure chamber 10), which are obtained when the upper electrode 45 is at the predetermined electric potential, are smaller than the deformation amounts which are obtained when the upper electrode 45 is retained at the ground electric potential.

After that, when the electric potential of the upper electrode 45 is returned to the ground electric potential, then the portions of the upper piezoelectric layer 42, the lower piezoelectric layer 41, and the vibration plate 40, which are opposed to the pressure chamber 10, are deformed to project toward the pressure chamber 10 as a whole in the same manner as described above, and the volume of the pressure chamber 10 is decreased. Accordingly, the pressure of the ink contained in the pressure chamber 10 is raised (pressure is applied to the ink contained in the pressure chamber 10), and the ink is discharged from the nozzle 15 communicated with the pressure chamber 10.

In the operation in which the piezoelectric actuator 32 is driven as described above, when the electric potential of the upper electrode 45 is switched from the ground electric potential to the predetermined electric potential, the first active portion R1 is elongated from the state of being shrunk to the state before being shrunk, simultaneously with which the second active portion R2 is shrunk. Therefore, the elongation of the first active portion R1 is partially absorbed by the shrinkage of the second active portion R2. On the other hand, when the electric potential of the upper electrode 45 is returned from the predetermined electric potential to the ground electric potential, then the first active portion R1 is shrunk, and the second active portion R2 is elongated to the state of before being shrunk. Therefore, the shrinkage of the first active portion R1 is partially absorbed by the elongation of the second active portion R2.

According to the fact as described above, the so-called crosstalk is suppressed, which would be otherwise caused such that the deformation of the portions of the lower piezoelectric layer 41 and the upper piezoelectric layer 42 opposed to the pressure chamber 10 is transmitted to the portion opposed to another pressure chamber 10, and the discharge characteristic of the ink discharged from the nozzle 15 communicated with the another pressure chamber 10 is varied.

In the waiting state described above and in the period in which the piezoelectric actuator 32 is driven, the electric potential difference is always generated at the portion of the lower piezoelectric layer 41 disposed between the intermediate electrode 44 and the lower electrode 43. The electric field, which is in the same direction as the polarization direction, is generated at the concerning portion of the lower piezoelectric layer 41. Accordingly, the concerning portion of the lower piezoelectric layer 41 is always in the state of being shrunk.

Next, an explanation will be made about a method for producing the ink-jet head 3 (piezoelectric actuator 32), in particular, about a method for polarizing the upper piezoelectric layer 42 and the lower piezoelectric layer 41 (first active portion R1 and second active portion R2). FIG. 7 shows steps of the polarization.

Figure 7A:
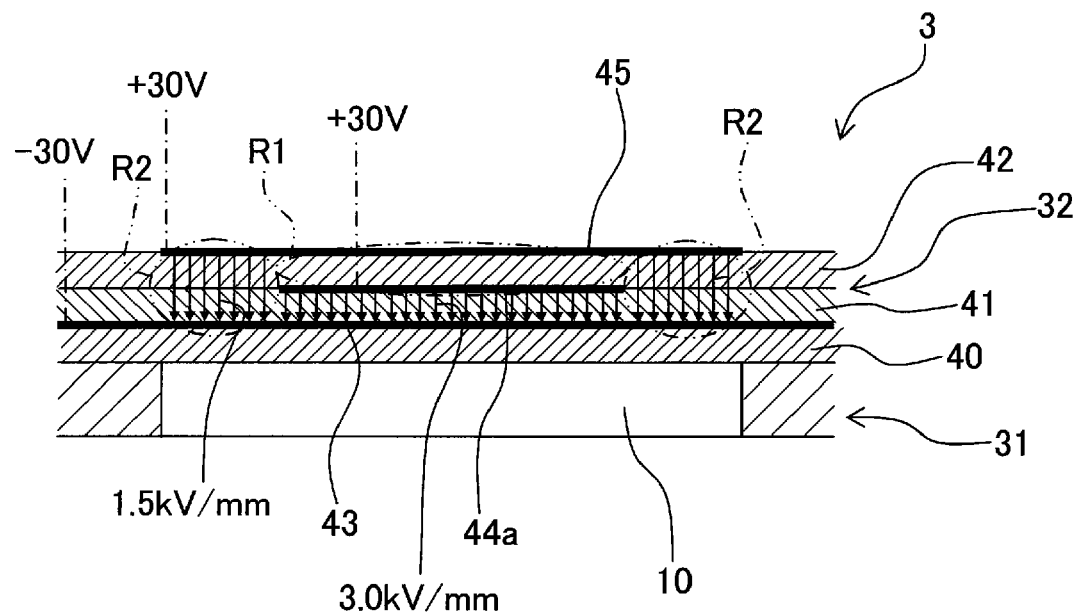
FIG. 7A and FIG. 7B show steps of producing the ink-jet head (piezoelectric actuator) in the embodiment of the present invention.

When the first active portion R1 and the second active portion R2 are polarized, at first, as shown in FIG. 7A, same electric potential (for example, about 30 V) is applied to the upper electrode 45 and the intermediate electrode 44 in the piezoelectric actuator 32 in a state in which the first active portion R1 and the second active portion R2 are not polarized, and an electric potential (for example, about −30 V) lower than the above is applied to the lower electrode 43 (second active portion-polarizing step). Accordingly, the electric potential difference is generated between the upper electrode 45 and the lower electrode 43 (polarizing voltage (electric field) is applied between the second electrode pair). An electric field of about 1.5 kV/mm, which is in the downward direction, is generated in the second active portion R2 interposed between the upper electrode 45 and the lower electrode 43. Accordingly, the second active portion R2 is polarized in the downward direction.

In this situation, the electric field difference is also generated between the intermediate electrode 44 and the lower electrode 43. An electric field of about 3.0 kV/mm, which is in the downward direction, is generated at the portion of the lower piezoelectric layer 41 interposed between these electrodes. Accordingly, the portion of the lower piezoelectric layer 41 is also polarized in the downward direction.

Figure 7B:
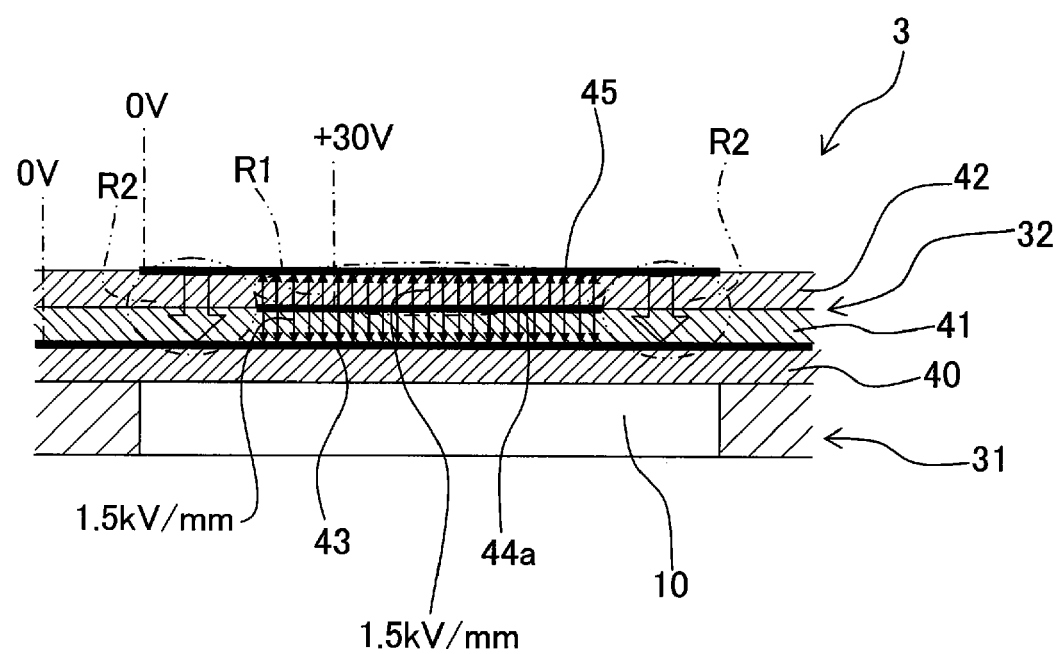

Subsequently, as shown in FIG. 7B, the upper electrode 45 and the lower electrode 43 are allowed to have an identical electric potential (for example, ground electric potential (0 V)), and an electric potential (for example, about 30 V) higher than the above is applied to the intermediate electrode 44 (first active portion-polarizing step). Accordingly, the electric potential difference is generated between the upper electrode 45 and the intermediate electrode 44 (polarizing voltage (electric field) is applied between the first electrode pair). An electric field of about 1.5 kV/mm, which is in the upward direction, is generated in the first active portion R1 interposed between the upper electrode 45 and the intermediate electrode 44. Accordingly, the first active portion R1 is polarized in the upward direction.

In this situation, the electric potential difference is also generated between the intermediate electrode 44 and the lower electrode 43. An electric field of about 1.5 kV/mm, which is in the downward direction, is generated at the portion of the lower piezoelectric layer 41 interposed between these electrodes. The electric field intensity of the electric field is smaller than the electric field intensity (about 3.0 kV/mm) of the electric field generated at the portion of the lower piezoelectric layer 41 when the second active portion R2 is polarized, and the direction of the electric field is the same as well. Therefore, the portion of the lower piezoelectric layer 41 is retained in the state of being polarized by the electric field of about 3.0 kV/mm.

Reversely to the embodiment of the present invention, if the second active portion R2 is polarized after polarizing the first active portion R1, the polarization of the portion of the first active portion R1 adjacent to the second active portion R2 is weakened by the electric field which is applied in order to polarize the second active portion R2.

On the other hand, as described above, various conditions (for example, the driving voltages applied to the upper electrode 45 and the intermediate electrode 44 and the areas of the upper electrode 45 and the intermediate electrode 44) are defined so that the deformation amounts of the upper piezoelectric layer 42, the lower piezoelectric layer 41, and the vibration plate 40, which are obtained when the electric field is generated in the first active portion R1, are greater than the deformation amounts of the upper piezoelectric layer 42, the lower piezoelectric layer 41, and the vibration plate 40 which are obtained when the electric field is generated in the second active portion R2, when the finally produced piezoelectric actuator 32 is driven. That is, the influence, which is exerted on the amount of change of the volume of the pressure chamber 10 due to the weakening of the polarization of the first active portion R1, is greater than the influence which is exerted on the amount of change of the volume of the pressure chamber 10 due to the weakening of the polarization of the second active portion R2.

Therefore, in this case, it is feared that the discharge characteristic of the ink discharged from the nozzle 15 (liquid transport efficiency) may be greatly deteriorated due to the weakening of the polarization of the first active portion R1 which has the great influence exerted on the amount of change of the volume of the pressure chamber 10.

On the other hand, the following procedure is also conceived in order to polarize the first active portion R1 and the second active portion R2 in the piezoelectric actuator 32 of the embodiment of the present invention. That is, for example, as shown in FIG. 8, the first active portion R1 and the second active portion R2 are simultaneously polarized, for example, such that the upper electrode 45 is allowed to have the ground electric potential (0 V), an electric potential (for example, about 30 V) higher than that of the upper electrode 45 is applied to the intermediate electrode 44, and an electric potential (for example, about −60 V) lower than those of the upper electrode 45 and the intermediate electrode 44 is applied to the lower electrode 43.

However, in the case of this procedure, the polarization of the portion of the second active portion R2 adjacent to the first active portion R1 is weakened by the electric field applied in order to polarize the first active portion R1. Further, the polarization of the portion of the first active portion R1 adjacent to the second active portion R2 is weakened by the electric field applied in order to polarize the second active portion R2. In the same manner as described above, it is feared that the discharge characteristic of the ink discharged from the nozzle 15 may be greatly deteriorated.

Figure 8:
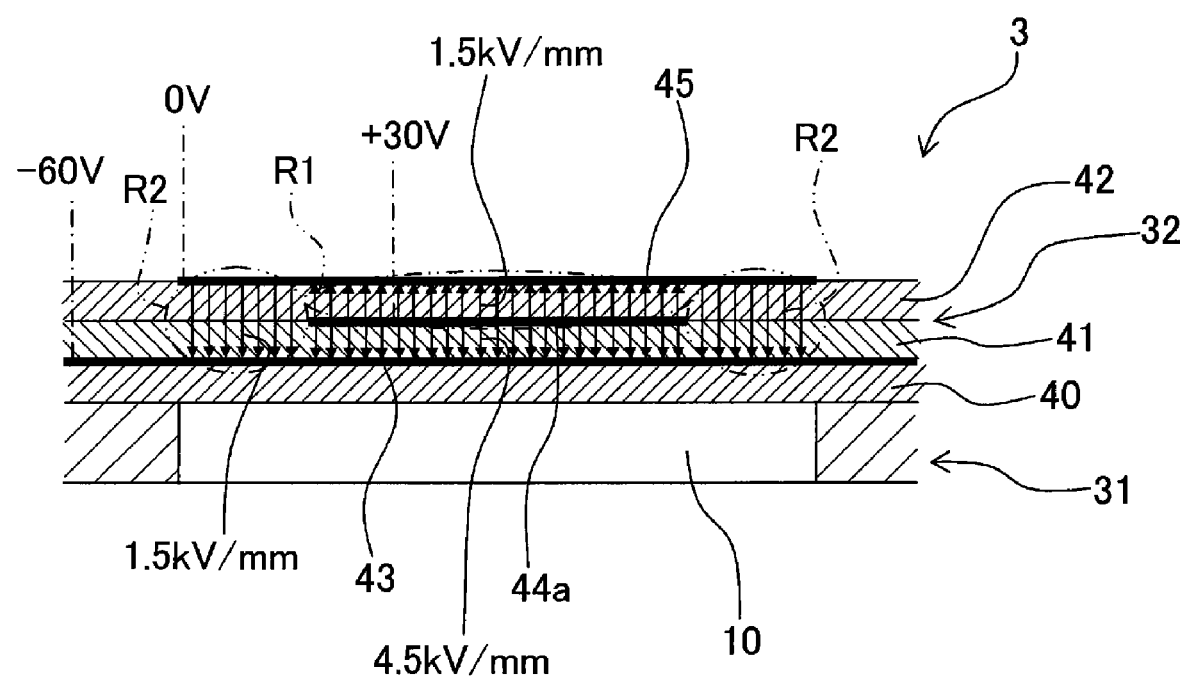
FIG. 8 shows electric potentials of respective electrodes of the piezoelectric actuator when a first active portion and a second active portion are simultaneously polarized.

Further, in the case of this procedure, as shown in FIG. 8, a large electric field of about 4.5 kV/mm is generated at the portion of the lower piezoelectric layer 41 interposed between the intermediate electrode 44 and the lower electrode 43. It is feared that any crack appears in the portion of the lower piezoelectric layer 41 interposed between the intermediate electrode 44 and the lower electrode 43 due to the electric field. If the crack exists, any large crevice gradually appears therefrom in some cases, which is not preferred in view of the durability.

On the contrary, in the embodiment of the present invention, the first active portion R1 is polarized after polarizing the second active portion R2. Therefore, the electric field, which is applied in order to polarize the second active portion R2, does not weaken the polarization at the portion of the first active portion R1, adjacent to the second active portion R2, at which the influence is greatly exerted on the amount of change of the volume of the pressure chamber 10.

Therefore, the change amount of the volume of the pressure chamber 10 is not greatly decreased when the piezoelectric actuator 32 is driven. As a result, it is possible to maximally suppress the deterioration of the discharge characteristic of the ink discharged from the nozzle 15.

The electric field, which is generated at the portion of the lower piezoelectric layer 41 interposed between the intermediate electrode 44 and the lower electrode 43, is small as compared with the case in which the first active portion R1 and the second active portion R2 are simultaneously polarized. Therefore, any crack hardly appears at the portion of the lower piezoelectric layer 41 interposed between the intermediate electrode 44 and the lower electrode 43. In other words, in the embodiment of the present invention, in order that any great electric field, at which the crack appears, is not generated at the portion of the lower piezoelectric layer 41 interposed between the intermediate electrode 44 and the lower electrode 43, the electric potential of the intermediate electrode 44, which does not directly relate to the polarization of the second active portion R2, is the same as the electric potential of the upper electrode 45 when the second active portion R2 is polarized, and the electric potential of the lower electrode 43, which does not directly relate to the polarization of the first active portion R1, is the same as the electric potential of the upper electrode 45 when the first active portion R1 is polarized.

It is generally known that the piezoelectric characteristic of the piezoelectric layer is deteriorated when the direction of polarization of the piezoelectric layer is inverted during the process for polarizing the piezoelectric layer. However, in the embodiment of the present invention, the first active portion R1 is merely polarized in the upward direction from the state of being not polarized, and the second active portion R2 is merely polarized in the downward direction from the state of being not polarized. That is, the direction of polarization is not inverted during the process in which the first active portion R1 and the second active portion R2 are polarized. Therefore, the piezoelectric characteristics of the first active portion R1 and the second active portion R2 are not deteriorated.

According to the embodiment explained above, in the piezoelectric actuator 32, the change amount of the volume of the pressure chamber 10, which is obtained when the upper piezoelectric layer 42, the lower piezoelectric layer 41, and the vibration plate 40 are deformed by generating the electric field in the first active portion R1 by applying the driving voltage (electric field) between the upper electrode 45 and the intermediate electrode 44, is greater than the change amount of the volume of the pressure chamber 10, which is obtained when the upper piezoelectric layer 42, the lower piezoelectric layer 41, and the vibration plate 40 are deformed by generating the electric field in the second active portion R2 by applying the driving voltage (electric field) between the upper electrode 45 and the lower electrode 43. Therefore, when the first active portion-polarizing step is performed after the second active portion-polarizing step, the polarization is not weakened at the portion of the first active portion R1 which is adjacent to the second active portion R2 and which exerts the great influence on the change amount of the volume of the pressure chamber 10. It is possible to maximally suppress the deterioration of the ink discharge characteristic.

The same electric potential (for example, 30 V) is applied to the upper electrode 45 and the intermediate electrode 44, the electric potential (for example, −30 V) lower than the above is applied to the lower electrode 43, and thus the second active portion R2 is polarized in the downward direction from the state of being not polarized. After that, the upper electrode 45 and the lower electrode 43 are allowed to have the identical electric potential (0 V), the electric potential (for example, 30 V) higher than the above is applied to the intermediate electrode 44, and thus the first active portion R1 is polarized in the upward direction from the state of being not polarized. That is, the direction of polarization is not inverted (the polarization is not effected in the opposite direction after the polarization is once effected in a certain direction) during the process for polarizing the first active portion R1 and the second active portion R2. Therefore, the piezoelectric characteristics of the first active portion R1 and the second active portion R2 are not deteriorated.

When the second active portion R2 is polarized, the electric potential of the intermediate electrode 44, which does not directly relate to the polarization of the second active portion R2, is the same as the electric potential of the upper electrode 45. When the first active portion R1 is polarized, the electric potential of the lower electrode 43, which does not directly relate to the polarization of the first active portion R1, is the same as the electric potential of the upper electrode 45. Accordingly, the electric field, which is generated at the portion of the lower piezoelectric layer 41 interposed between the intermediate electrode 44 and the lower electrode 43, is decreased as compared with the case in which the first active portion R1 and the second active portion R2 are simultaneously polarized. Accordingly, it is possible to avoid the appearance of the crack at the concerning portion of the lower piezoelectric layer 41.

Next, modified embodiments, in which various modifications are applied to the embodiment of the present invention, will be explained. However, components or parts, which are constructed in the same manner as those of the embodiment of the present invention, are designated by the same reference numerals, any explanation of which will be appropriately omitted.

Figure 9A:
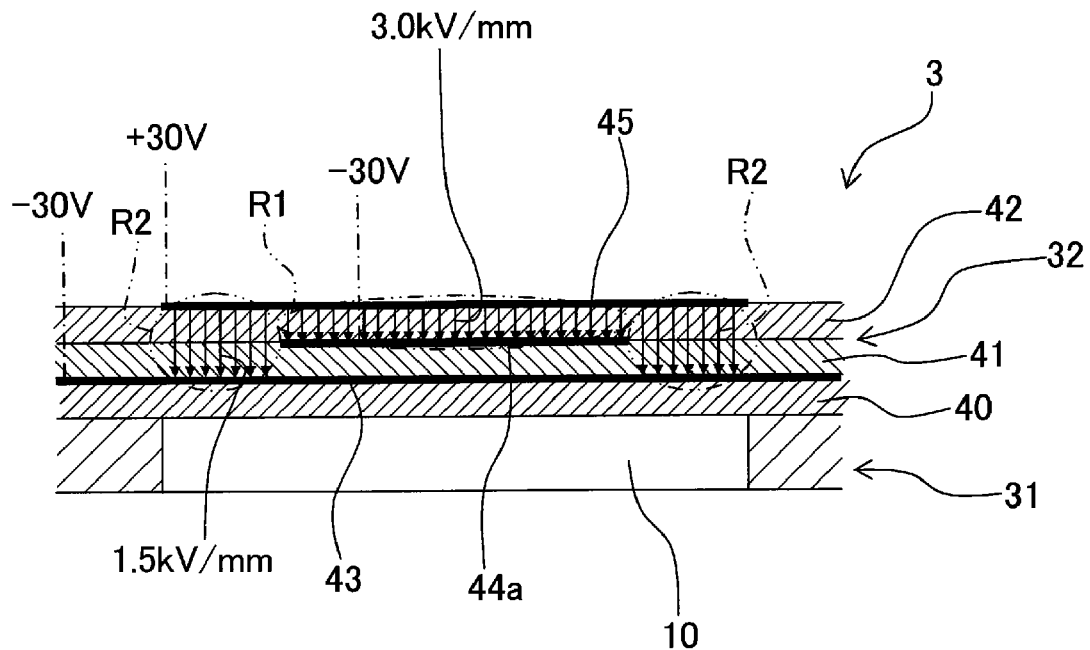
FIG. 9A and FIG. 9B show a first modified embodiment corresponding to FIG. 7.

The steps of polarizing the first active portion R1 and the second active portion R2 are not limited to those of the embodiment described above. In one modified embodiment, the following procedure is adopted when the first active portion R1 and the second active portion R2 are polarized. That is, at first, as shown in FIG. 9A, same electric potential (for example, about −30 V) is applied to the intermediate electrode 44 and the lower electrode 43, and an electric potential (for example, about 30 V) higher than the above is applied to the upper electrode 45 to polarize the second active portion R2 (second active portion-polarizing step). After that, as shown in FIG. 9B, the upper electrode 45 and the lower electrode 43 are allowed to have the ground electric potential (0 V) as the identical electric potential, and an electric potential (for example, about 30 V) higher than the above is applied to the intermediate electrode 44 to polarize the first active portion R1 (first active portion-polarizing step) (first modified embodiment).

This procedure will be explained in more detail below. When the electric potentials of the respective electrodes are changed as shown in FIG. 9A, then the electric potential difference arises between the upper electrode 45 and the lower electrode 43 (polarizing voltage (electric field) is applied between the second electrode pair), and the electric field of about 1.5 kV/mm, which is in the downward direction, is generated in the second active portion R2 which is included in the portions of the upper piezoelectric layer 42 and the lower piezoelectric layer 41 interposed between the electrodes and from which the portion opposed to the intermediate electrode 44 is excluded. Accordingly, the second active portion R2 is polarized in the downward direction.

In this situation, the electric field of about 3.0 kV/mm, which is in the downward direction, is generated at the portion of the upper piezoelectric layer 42 interposed between the upper electrode 45 and the lower electrode 43 in accordance with the electric potential difference between the electrodes. The portion of the upper piezoelectric layer 42 is polarized in the downward direction. In this situation, any electric field is not generated at the portion of the lower piezoelectric layer 41 interposed between the intermediate electrode 44 and the lower electrode 43.

Figure 9B:
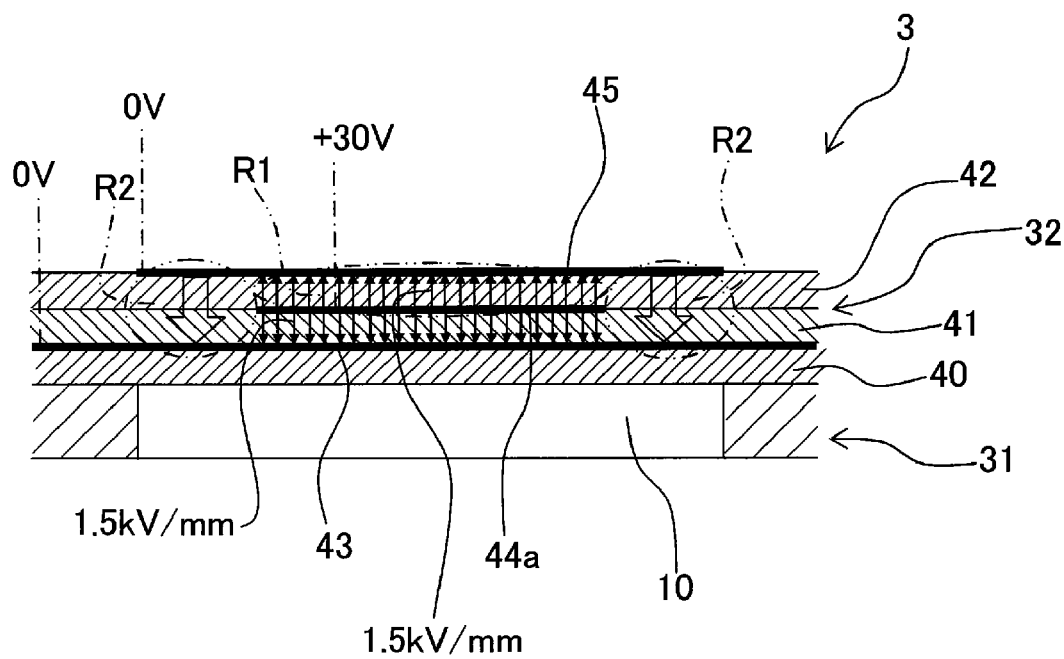

Subsequently, when the electric potentials of the respective electrodes are changed as shown in FIG. 9B, then the electric potential difference is generated between the upper electrode 45 and the intermediate electrode 44 (polarizing voltage (electric field) is applied between the first electrode pair), and the electric field of about 1.5 kV/mm, which is in the upward direction, is generated in the first active portion R1 of the upper piezoelectric layer 42 interposed between the electrodes. The electric field intensity of the electric field is smaller than the electric field intensity (about 3.0 kV/mm) of the electric field having been generated at the portion of the upper piezoelectric layer 42 in the second active portion-polarizing step. However, the direction of the former electric field is opposite to the direction of the latter electric field. Therefore, the first active portion R1 is polarized in the upward direction by the electric field of about 1.5 kV/mm.

In this situation, the electric field of about 1.5 kV/mm, which is in the downward direction, is generated at the portion of the lower piezoelectric layer 41 interposed between the intermediate electrode 44 and the lower electrode 43 in accordance with the electric potential difference between the electrodes. Accordingly, the portion of the lower piezoelectric layer 41 is polarized in the downward direction.

When the first active portion R1 and the second active portion R2 are polarized as described above, then the polarization direction of the first active portion R1 is inverted during the process for polarizing the first active portion R1, and the piezoelectric characteristic of the first active portion R1 is deteriorated to some extent as described above. However, the first active portion R1 is polarized after polarizing the second active portion R2. Therefore, the polarization is not weakened at the portion of the first active portion R1 adjacent to the second active portion. Therefore, the change amount of the volume of the pressure chamber 10 is not greatly decreased when the piezoelectric actuator 32 is driven. It is possible to maximally suppress the deterioration of the discharge characteristic of the ink discharged from the nozzle 15.

In the case of the first modified embodiment, the electric field intensity of the electric field generated at the portion of the lower piezoelectric layer 41 interposed between the intermediate electrode 44 and the lower electrode 43 is about 1.5 kV/mm at the maximum. This electric field intensity is smaller than the maximum electric field intensity (about 3.0 kV/mm) generated at the portion of the lower piezoelectric layer 41 in the embodiment described above. Any crack appears more scarcely at the portion of the lower piezoelectric layer 41. The durability of the piezoelectric actuator 32 is improved.

Figure 10A:
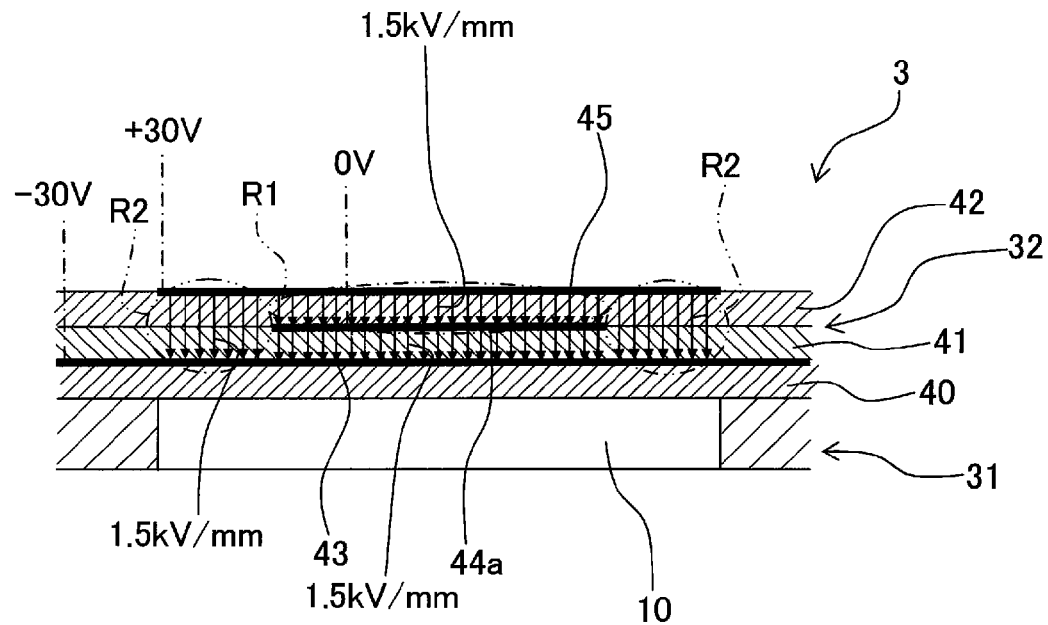
FIG. 10A and FIG. 10B show a second modified embodiment corresponding to FIG. 7.

In another modified embodiment, the following procedure is adopted when the first active portion R1 and the second active portion R2 are polarized. That is, at first, as shown in FIG. 10A, the lower electrode 43 is allowed to have an electric potential lower than that of the upper electrode 45 (for example, an electric potential of about 30 V is applied to the upper electrode 45 and an electric potential of about −30 V is applied to the lower electrode 43), the intermediate electrode 44 is allowed to have an electric potential (for example, about 0 V) between those of the lower electrode 43 and the upper electrode 45, and thus the second active portion R2 is polarized (second active portion-polarizing step). After that, in the same manner as in the first modified embodiment, as shown in FIG. 10B, the upper electrode 45 and the lower electrode 43 are allowed to have an identical electric potential, i.e., the ground electric potential (0 V), an electric potential (for example, about 30 V) higher than the above is applied to the intermediate electrode 44, and thus the first active portion R1 is polarized (first active portion-polarizing step) (second modified embodiment).

The procedure will be explained in more detail below. When the electric potentials of the respective electrodes are changed as shown in FIG. 10A, then the electric potential difference arises between the upper electrode 45 and the lower electrode 43 (polarizing voltage (electric field) is applied between the second electrode pair), and the electric field of about 1.5 kV/mm, which is directed in the downward direction, is generated in the second active portion R2 which is included in the portions of the upper piezoelectric layer 42 and the lower piezoelectric layer 41 interposed between the upper electrode 45 and the lower electrode 43 and from which the portion opposed to the intermediate electrode 44 is excluded. Accordingly, the second active portion R2 is polarized in the downward direction.

In this situation, the electric field of about 1.5 kV/mm, which is directed in the downward direction, is generated at the portion of the upper piezoelectric layer 42 interposed between the upper electrode 45 and the intermediate electrode 44 in accordance with the electric potential difference between the electrodes. The portion of the upper piezoelectric layer 42 is polarized in the downward direction. Further, the electric field of about 1.5 kV/mm, which is directed in the downward direction, is generated at the portion of the lower piezoelectric layer 41 interposed between the intermediate electrode 44 and the lower electrode 43 in accordance with the electric potential difference between the intermediate electrode 44 and the lower electrode 43. The portion of the lower piezoelectric layer 41 is polarized in the downward direction.

Figure 10B:
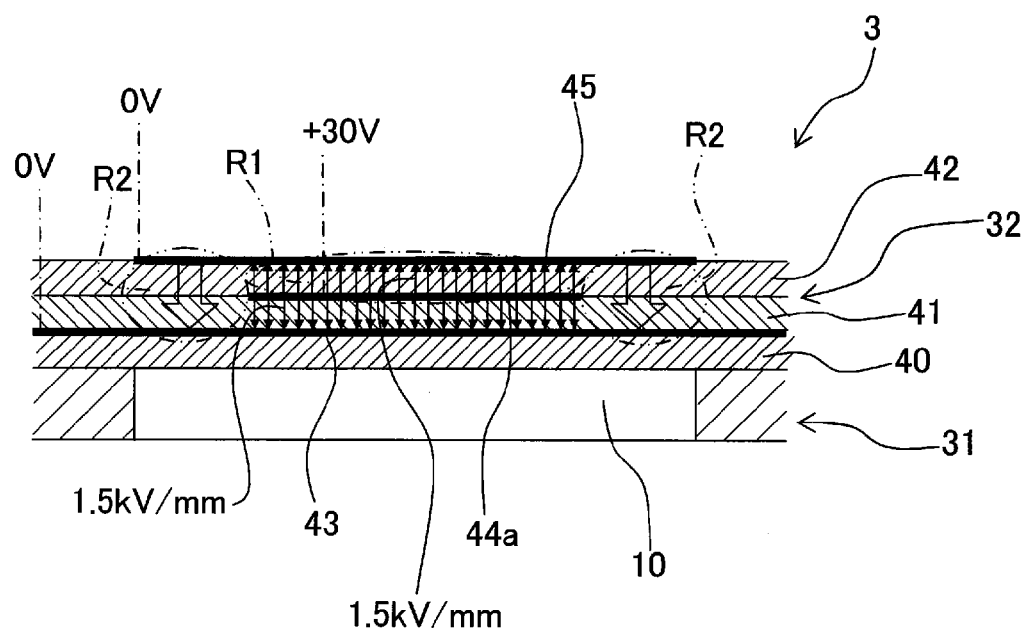
Figure 11C:
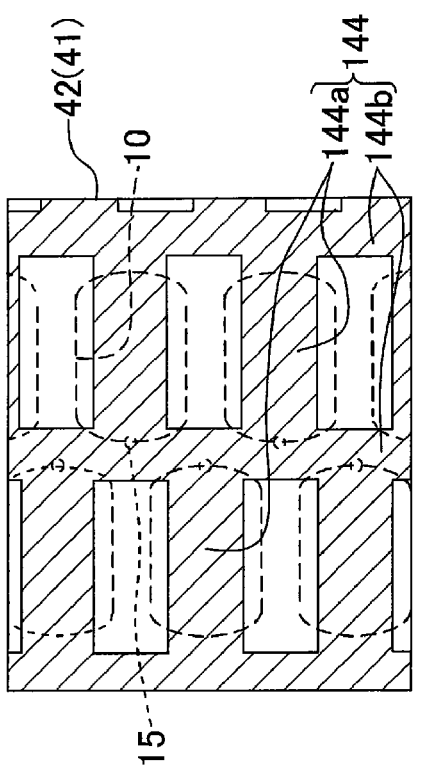
FIGS. 11A to 11D show a third modified embodiment corresponding to FIG. 4.
Figure 11D:
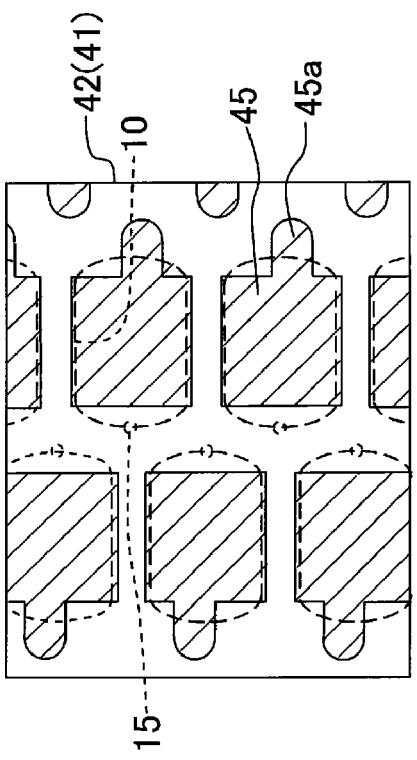
Figure 11A:
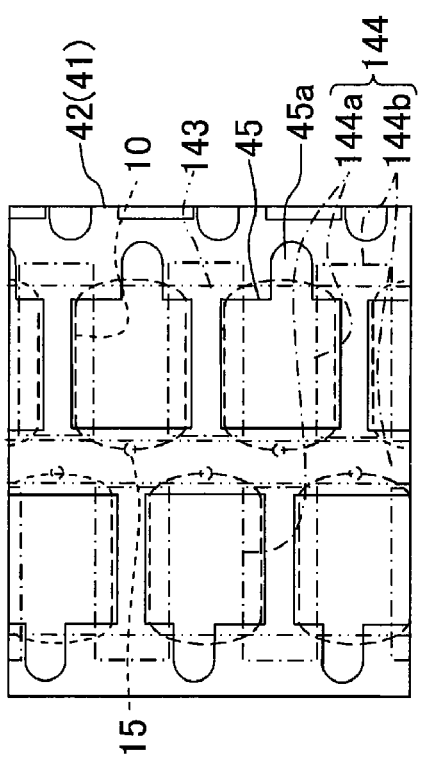
Figure 11B:
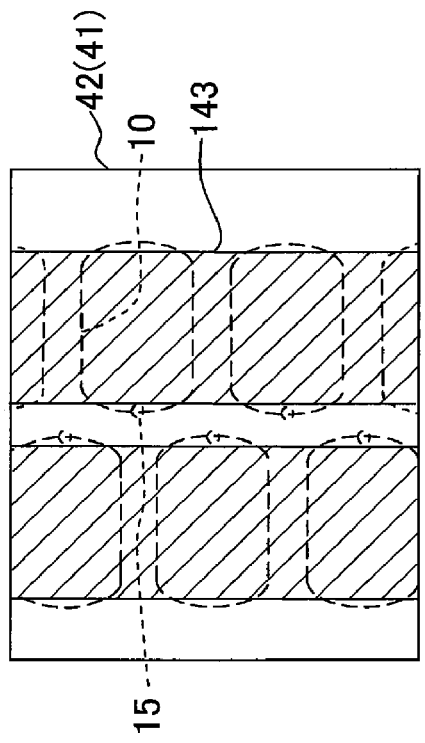

Subsequently, when the electric potentials of the respective electrodes are changed as shown in FIG. 10B, then the electric potential difference arises between the upper electrode 45 and the intermediate electrode 44 (polarizing voltage (electric field) is applied between the first electrode pair), and the electric field of about 1.5 kV/mm, which is directed in the upward direction, is generated in the first active portion R1 of the upper piezoelectric layer 42 interposed between the electrodes. The direction of the electric field is opposite to the direction of the electric field having been generated in this portion of the upper piezoelectric layer 42 in the second active portion-polarizing step. Therefore, the direction of polarization of the first active portion R1 is inverted by the electric field which is directed in the upward direction, and the first active portion R1 is polarized in the upward direction.

In this situation, the electric field of about 1.5 kV/mm, which is directed in the downward direction, is generated at the portion of the lower piezoelectric layer 41 interposed between the intermediate electrode 44 and the lower electrode 43 in accordance with the electric potential difference between the electrodes. Accordingly, the portion of the lower piezoelectric layer 41 is polarized in the downward direction.

When the first active portion R1 and the second active portion R2 are polarized as described above, then the direction of polarization of the first active portion R1 is inverted during the process for polarizing the first active portion R1, and the piezoelectric characteristic of the first active portion R1 is deteriorated to some extent as described above. However, the first active portion R1 is polarized after polarizing the second active portion R2. Therefore, the polarization is not weakened at the portion of the first active portion R1 adjacent to the second active portion R2. Therefore, the change amount of the volume of the pressure chamber 10 is not greatly decreased when the piezoelectric actuator 32 is driven. It is possible to maximally suppress the deterioration of the discharge characteristic of the ink discharged from the nozzle 15.

Also in the case of the second modified embodiment, the electric field, which is generated at the portion of the lower piezoelectric layer 41 interposed between the intermediate electrode 44 and the lower electrode 43, has the electric field intensity which is about 1.5 kV/mm at the maximum in the same manner as in the first modified embodiment. The electric field intensity is smaller than the maximum electric field intensity (about 3.0 kV/mm) of the electric field generated at the portion of the lower piezoelectric layer 41 in the embodiment described above. The crack is generated more scarcely at the portion of the lower piezoelectric layer 41, and the durability of the piezoelectric actuator 32 is improved.

Further, in the case of the second modified embodiment, the electric field generated in the first active portion R1 is about 1.5 kV/mm at the maximum. This electric field intensity is smaller than the maximum electric field intensity (about 3.0 kV/mm) generated in the first active portion R1 in the embodiment described above and in the first modified embodiment. The crack is generated more scarcely in the first active portion R1, and the durability of the piezoelectric actuator 32 is improved.

The electric potentials, which are applied to the respective electrodes 43, 44, 45 of the piezoelectric layers when the first active portion R1 and the second active portion R2 are polarized, are not limited to those explained above, provided that the electric field difference is generated to such an extent that the electric field, which is required to polarize the first active portion R1 and the second active portion R2, is generated between the respective electrodes 43, 44, 45.

The structure or arrangement of the piezoelectric actuator is not limited to the structure or arrangement described in the embodiment. In still another modified embodiment, as shown in FIGS. 11A to 11D, a lower electrode 143 and an intermediate electrode 144 are arranged in place of the lower electrode 43 and the intermediate electrode 44 (see FIG. 4) of the embodiment described above (third modified embodiment).

The lower electrode 143 extends in the paper feeding direction (upward-downward direction as shown in FIG. 11) along the respective pressure chamber arrays 8. The lower electrode 143 is opposed to the plurality of pressure chambers 10 which form the pressure chamber arrays 8. Although not shown, the portions, which extend in the paper feeding direction, are connected to one another.

The intermediate electrode 144 has a plurality of opposing portions 144a which are arranged to be opposed to the plurality of pressure chambers 10 in the same manner as the opposing portions 44a (see FIG. 4), and a connecting portion 144b which extends in the paper feeding direction at portions opposed to the spaces between the respective pressure chamber arrays 8 and which mutually connects the ends of the plurality of opposing portions 144a corresponding to the plurality of pressure chambers 10 which form the adjoining pressure chamber arrays 8.

Also in the piezoelectric actuator as described above, the cross section, which corresponds to FIG. 4, is equivalent to that of the piezoelectric actuator 32 (as obtained by replacing the reference numeral 43 with the reference numeral 143 and replacing the reference numeral 44a with the reference numeral 144a with reference to FIG. 4). The first active portion R1 is polarized after polarizing the second active portion R2 in the same manner as in the embodiment described above, and thus the polarization is not weakened the portion of the first active portion R1 adjacent to the second active portion R2. Accordingly, it is possible to maximally suppress the deterioration of the discharge characteristic of the ink discharged from the nozzle 15 when the piezoelectric actuator is driven, in the same manner as in the embodiment described above.

Figure 12:
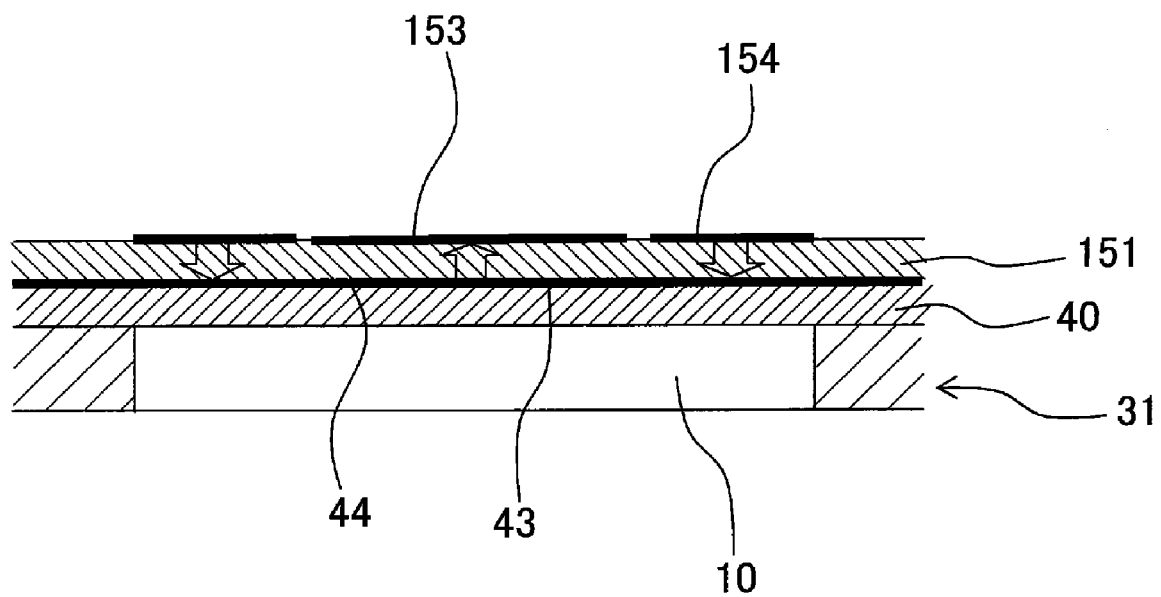
FIG. 12 shows a fourth modified embodiment corresponding to FIG. 6.

In the embodiment described above, the piezoelectric layer according to the present invention is formed by mutually stacking the lower piezoelectric layer 41 and the upper piezoelectric layer 42. However, there is no limitation thereto. In still another modified embodiment, as shown in FIG. 12, one piezoelectric layer 151 is arranged on the upper surface of the vibration plate 40. An electrode 153 is arranged at a portion opposed to a substantially central portion of the pressure chamber 10 on the upper surface of the piezoelectric layer 151. Further, an electrode 154 is arranged at portions opposed to the both ends of the pressure chamber 10 disposed on the outer side as compared with the portion of the pressure chamber 10 opposed to the electrode 153.

The portion of the piezoelectric layer 151, which is interposed between the lower electrode 43 and the electrode 153, is polarized in the upward direction directed from the lower electrode 43 to the electrode 153. The portion, which is interposed between the lower electrode 43 and the electrode 154, is polarized in the downward direction directed from the electrode 154 to the lower electrode 43 (fourth modified embodiment).

In such a piezoelectric actuator, when the driving voltage (electric field) is applied between the electrode 153 and the lower electrode 43 to shrink the first active portion R3 in the horizontal direction, the portions of the piezoelectric layer 151 and the vibration plate 40, which are opposed to the pressure chamber 10, are deformed to project toward the pressure chamber 10. When the driving voltage (electric field) is applied between the electrode 154 and the lower electrode 43 to shrink the second active portion R4 in the horizontal direction, the portions of the piezoelectric layer 151 and the vibration plate 40, which are opposed to the pressure chamber 10, are deformed to project toward the side opposite to the pressure chamber 10.

For example, when the widths of the electrode 153 and the electrode 154 are appropriately defined, the deformation amounts of the piezoelectric layer 151 and the vibration plate 40, i.e., the change amount of the volume of the pressure chamber 10, which is/are obtained when the driving voltage (electric field) is applied between the electrode 153 and the lower electrode 43, can be made greater or smaller than those obtained when the driving voltage (electric field) is applied between the electrode 154 and the lower electrode 43.

When the change amount of the volume of the pressure chamber 10, which is obtained when the driving voltage (electric field) is applied between the electrode 153 and the lower electrode 43, is made greater than that obtained when the driving voltage (electric field) is applied between the electrode 154 and the lower electrode 43, then the portion of the piezoelectric layer 151, which is interposed between the electrode 153 and the lower electrode 43, is the first active portion according to the present invention, and the first electrode pair according to the present invention is formed by the electrode 153 and the lower electrode 43 which interpose the first active portion. The portion of the piezoelectric layer 151, which is interposed between the electrode 154 and the lower electrode 43 and which is adjacent to the first active portion, is the second active portion according to the present invention. The second electrode pair according to the present invention is formed by the electrode 154 and the lower electrode 43 which interpose the second active portion.

In this case, the polarizing voltage (electric field) is applied between the electrode 154 and the lower electrode 43 (between the second electrode pair) to polarize the portion (second active portion) of the piezoelectric layer 151 interposed between the electrodes in the downward direction, and then the polarizing voltage (electric field) is applied between the electrode 153 and the lower electrode 43 (between the first electrode pair) to polarize the portion (first active portion) of the piezoelectric layer 151 interposed between the electrodes in the upward direction.

On the other hand, reversely to the above, when the change amount of the volume of the pressure chamber 10, which is obtained when the driving voltage (electric field) is applied between the electrode 153 and the lower electrode 43, is made smaller than that obtained when the driving voltage (electric field) is applied between the electrode 154 and the lower electrode, then the portion of the piezoelectric layer 151, which is interposed between the electrode 154 and the lower electrode 43, is the first active portion according to the present invention, and the first electrode pair according to the present invention is formed by the electrode 154 and the lower electrode 43 which interpose the first active portion. The portion of the piezoelectric layer 151, which is interposed between the electrode 153 and the lower electrode 43 and which is adjacent to the first active portion, is the second active portion according to the present invention. The second electrode pair according to the present invention is formed by the electrode 153 and the lower electrode 43 which interpose the second active portion.

In this case, the polarizing voltage (electric field) is applied between the electrode 153 and the lower electrode 43 (between the second electrode pair) to polarize the portion (second active portion) of the piezoelectric layer 151 interposed between the electrodes in the upward direction, and then the polarizing voltage (electric field) is applied between the electrode 154 and the lower electrode 43 (between the first electrode pair) to polarize the portion (first active portion) of the piezoelectric layer 151 interposed between the electrodes in the downward direction.

Also in these cases, the first active portion is polarized after polarizing the second active portion. Therefore, the polarization is not weakened at the portion of the first active portion adjacent to the second active portion. It is possible to maximally suppress the deterioration of the discharge characteristic of the ink discharged from the nozzle 15 in the same manner as in the embodiment described above.

In the foregoing description, one of the first active portion and the second active portion, which is opposed to the substantially central portion of the pressure chamber 10, is polarized in the upward direction, and the other is polarized in the downward direction. However, reversely to the above, one of the first active portion and the second active portion, which is opposed to the substantially central portion of the pressure chamber 10, may be polarized in the downward direction, and the other may be polarized in the upward direction. In this case, when the piezoelectric actuator is driven and when the first active portion and the second active portion are polarized, the driving voltage (electric field) may be applied between the respective electrodes so that the electric field is generated in the direction opposite to the direction explained above.

In the foregoing description, the piezoelectric layer is arranged on the upper surface of the vibration plate 10 which covers the pressure chambers 10. However, for example, when the vibration plate 40 is formed of a conductive material such as a metal, then an insulating layer may be arranged on the upper surface of the vibration plate 40, and the piezoelectric layer may be arranged on the upper surface of the insulating layer (on the side of the vibration plate 40 opposite to the pressure chamber 10).

In the foregoing description, the portion of the piezoelectric layer opposed to the substantially central portion of the pressure chamber 10 and the portion of the piezoelectric layer disposed on the outer side as compared with the foregoing portion of the pressure chamber 10 are polarized in the mutually opposite directions in the piezoelectric actuator. However, there is no limitation thereto. Mutually adjoining portions of the piezoelectric layer, which are different from those explained above, may be polarized in the mutually opposite directions.

In the foregoing description, the piezoelectric actuator is the so-called unimorph type piezoelectric actuator in which the portions of the piezoelectric layer and the vibration plate 40 opposed to the pressure chamber 10 are deformed by shrinking the piezoelectric layer. However, any piezoelectric actuator other than those of the unimorph type is also available provided that the portions of the piezoelectric layer, which are adjacent to one another, are polarized in the mutually opposite directions.

In the foregoing description, the examples have been explained, in which the present invention is applied to the production of the ink-jet head which discharges the inks from the nozzles 15 by applying the pressure to the inks contained in the pressure chambers 10 by changing the volumes of the pressure chambers 10. However, there is no limitation thereto. The present invention is also applicable to the production of any liquid discharge head for discharging any liquid other then the ink from the nozzle, and any liquid transport apparatus for transporting any liquid contained in the liquid flow passage including the pressure chamber by applying the pressure to the liquid contained in the pressure chamber.

Further, the present invention is not limited to the production of the piezoelectric actuator for applying the pressure to the liquid contained in the pressure chamber. The present invention is also applicable to the production of any piezoelectric actuator for driving any predetermined operating section.

What is claimed is:

1. A method for producing a liquid transport apparatus, the liquid transport apparatus including: a flow passage unit which is formed with a liquid transport flow passage including a pressure chamber; and a piezoelectric actuator which applies a pressure to a liquid in the pressure chamber by changing a volume of the pressure chamber, the piezoelectric actuator including: a piezoelectric layer having a first active portion which is polarized in a predetermined direction parallel to a thickness direction of the piezoelectric layer and a second active portion which is adjacent to the first active portion and polarized in a direction opposite to the predetermined direction; a pair of first electrodes which interpose the first active portion in the thickness direction of the piezoelectric layer; a pair of second electrodes which interpose the second active portion in the thickness direction of the piezoelectric layer, a change amount of the volume of the pressure chamber, which is obtained by deforming the piezoelectric layer by applying a driving voltage between the first electrodes, being greater than a change amount of the volume of the pressure chamber, which is obtained by deforming the piezoelectric layer by applying the driving voltage between the second electrodes; and a vibration plate which covers the pressure chamber, the piezoelectric layer being arranged on a side of the vibration plate not facing the pressure chamber, the method comprising:

polarizing the second active portion in the direction opposite to the predetermined direction by applying a polarizing voltage between the pair of second electrodes; and polarizing the first active portion in the predetermined direction by applying the polarizing voltage between the pair of first electrodes after polarizing the second active portion, wherein: the piezoelectric layer has a first piezoelectric layer which is arranged on a surface of the vibration plate, on a side opposite to the pressure chamber, and an second piezoelectric layer which is arranged on a surface of the first piezoelectric layer, on a side opposite to the vibration plate;

the pair of first electrodes is constructed of a first electrode arranged on the surface of the second piezoelectric layer, on the side opposite to the first piezoelectric layer to extend over a portion of the second piezoelectric layer opposed to the first and second active portions, and an intermediate electrode arranged between the second piezoelectric layer and the first piezoelectric layer to be opposed to the first active portion;

the pair of second electrodes is constructed of the first electrode and a second electrode which is arranged on a surface of the first piezoelectric layer, facing the vibration plate to range over a portion of the first piezoelectric layer to be opposed to the first and second active portions;

when the second active portion is polarized, the polarizing voltage is applied between the first electrode and the second electrode by applying, to the second electrode, an electric potential lower than that applied to the first electrode in a state that an electric potential applied to the intermediate electrode is substantially equal to an electric potential applied to the first electrode; and when the first active portion is polarized, the polarizing voltage is applied between the first electrode and the intermediate electrode by applying, to the intermediate electrode, an electric potential greater than that applied to the first electrode in a state that an electric potential applied to the second electrode is substantially equal to an electric potential applied to the first electrode.

2. The method for producing the liquid transport apparatus according to claim 1, wherein the first active portion is opposed to a portion of the pressure chamber; and the second active portion is opposed to another portion of the pressure chamber, adjacent to the portion of the pressure chamber.

3. The method for producing the liquid transport apparatus according to claim 2, wherein the first active portion is opposed to a central portion of the pressure chamber, and the second active portion is opposed to an outer portion disposed outside the central portion of the pressure chamber opposed to the first active portion.

4. The method for producing the liquid transport apparatus according to claim 3, wherein the first active portion is provided at a portion of the second piezoelectric layer opposed to the central portion of the pressure chamber; and the second active portion is provided at a portion of the first piezoelectric layer and a portion of the second piezoelectric layer which are opposed to the outside portion of the pressure chamber disposed outside the central portion of the pressure chamber opposed to the first active portion.

5. The method for producing the liquid transport apparatus according to claim 1, wherein the first active portion, polarized by applying the polarized voltage between the pair of first electrodes, is disposed at a portion of the piezoelectric layer opposed to a central portion of the pressure chamber; and the second active portion, polarized by applying the polarized voltage between the pair of second electrodes, is disposed at a portion of the piezoelectric layer opposed to a laterally outward portion of the pressure chamber, which is outside the central portion of the pressure chamber opposed to the first active portion.

6. A method for producing a piezoelectric actuator usable for a liquid transport apparatus, the liquid transport apparatus including: a flow passage unit which is formed with a liquid transport flow passage including a pressure chamber; and a piezoelectric actuator which applies a pressure to a liquid in the pressure chamber by changing a volume of the pressure chamber, the piezoelectric actuator including: a piezoelectric layer having a first active portion which is polarized in a predetermined direction parallel to a thickness direction of the piezoelectric layer and a second active portion which is adjacent to the first active portion and polarized in a direction opposite to the predetermined direction; a pair of first electrodes which interpose the first active portion in the thickness direction of the piezoelectric layer; a pair of second electrodes which interpose the second active portion in the thickness direction of the piezoelectric layer, a change amount of the volume of the pressure chamber, which is obtained by deforming the piezoelectric layer by applying a driving voltage between the first electrodes, being greater than a change amount of the volume of the pressure chamber, which is obtained by deforming the piezoelectric layer by applying the driving voltage between the second electrodes; and a vibration plate which covers the pressure chamber, the piezoelectric layer being arranged on a side of the vibration plate not facing the pressure chamber, the method comprising:

polarizing the second active portion in the direction opposite to the predetermined direction by applying a polarizing voltage between the pair of second electrodes; and polarizing the first active portion in the predetermined direction by applying the polarizing voltage between the pair of first electrodes after polarizing the second active portion, wherein: the piezoelectric layer has a first piezoelectric layer which is arranged on a surface, of the vibration plate, on a side opposite to the pressure chamber, and a second piezoelectric layer which is arranged on a surface, of the first piezoelectric layer, on a side opposite to the vibration plate;

the pair of first electrodes is constructed of a first electrode arranged on the surface, of the second piezoelectric layer, on the side opposite to the first piezoelectric layer to range over a portion of the second piezoelectric layer opposed to the first and second active portions, and an intermediate electrode arranged between the second piezoelectric layer and the first piezoelectric layer to be opposed to the first active portion;

the pair of second electrodes is constructed of the first electrode and a second electrode which is arranged on a surface, of the first piezoelectric layer, facing the vibration plate to range over a portion of the first piezoelectric layer to be opposed to the first and second active portions;

when the second active portion is polarized, the polarizing voltage is applied between the first electrode and the second electrode by applying, to the second electrode, an electric potential lower than that applied to the first electrode in a state that an electric potential applied to the intermediate electrode is substantially equal to an electric potential applied to the first electrode; and when the first active portion is polarized, the polarizing voltage is applied between the first electrode and the intermediate electrode by applying, to the intermediate electrode, an electric potential greater than that applied to the first electrode in a state that an electric potential applied to the second electrode is substantially equal to an electric potential applied to the first electrode.

7. The method for producing the liquid transport apparatus according to claim 6, wherein the first active portion, polarized by applying the polarized voltage between the pair of first electrodes, is disposed at a portion of the piezoelectric layer opposed to a central portion of the pressure chamber; and the second active portion, polarized by applying the polarized voltage between the pair of second electrodes, is disposed at a portion of the piezoelectric layer opposed to a laterally outward portion of the pressure chamber, which is outside the central portion of the pressure chamber opposed to the first active portion.

* * * * *